(12) United States Patent
Hayashi

(10) Patent No.: US 12,062,600 B2
(45) Date of Patent: Aug. 13, 2024

(54) LEAD FRAME AND SEMICONDUCTOR DEVICE

(71) Applicant: SHINKO ELECTRIC INDUSTRIES CO., LTD., Nagano (JP)

(72) Inventor: Shintaro Hayashi, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 224 days.

(21) Appl. No.: 17/644,640

(22) Filed: Dec. 16, 2021

(65) Prior Publication Data

US 2022/0208664 A1 Jun. 30, 2022

(30) Foreign Application Priority Data

Dec. 28, 2020 (JP) ................................. 2020-218326

(51) Int. Cl.
*H01L 23/495* (2006.01)
*H01L 23/31* (2006.01)

(52) U.S. Cl.
CPC ........ *H01L 23/49575* (2013.01); *H01L 23/31* (2013.01); *H01L 23/49541* (2013.01)

(58) Field of Classification Search
CPC ........... H01L 23/49541; H01L 23/3107; H01L 2924/181; H01L 2224/48247
USPC ....................................................... 257/666
See application file for complete search history.

(56) References Cited

U.S. PATENT DOCUMENTS

| 2009/0146280 | A1* | 6/2009 | Shimazaki | H01L 23/49548 257/676 |
| 2014/0001620 | A1* | 1/2014 | Shimizu | H01L 23/4952 257/676 |
| 2020/0312753 | A1* | 10/2020 | Hishiki | H01L 23/49582 |

FOREIGN PATENT DOCUMENTS

| JP | 2008-187045 | 8/2008 |
| JP | 2016-105432 | 6/2016 |
| JP | 2017-005149 | 1/2017 |
| JP | 2017-055044 | 3/2017 |
| JP | 2019-040994 | 3/2019 |

OTHER PUBLICATIONS

Office Action mailed on Mar. 26, 2024 issued with respect to the basic Japanese Patent Application No. 2020-218326.

* cited by examiner

*Primary Examiner* — Kimberly N Rizkallah
*Assistant Examiner* — Dilinh P Nguyen
(74) *Attorney, Agent, or Firm* — IPUSA, PLLC

(57) ABSTRACT

A lead frame includes a first area, situated on a first surface of the lead frame, for mounting a semiconductor chip, and a second area, situated on the first surface of the lead frame, around the first area, wherein the second area includes a roughened area and a less-rough area situated between the roughened area and the first area, the less-rough area having a higher flatness than the roughened area.

20 Claims, 21 Drawing Sheets

1.00 μm 1.00 μm

LEAD FRAME AND SEMICONDUCTOR DEVICE

CROSS-REFERENCE TO RELATED APPLICATIONS

The present application is based upon and claims the benefit of priority from the prior Japanese Patent Application No. 2020-218326 filed on Dec. 28, 2020, with the Japanese Patent Office, the entire contents of which are incorporated herein by reference.

FIELD

The disclosures herein relate to lead frames, methods of making lead frames, and semiconductor devices.

BACKGROUND

A semiconductor device having a semiconductor chip mounted on a lead frame and encapsulated with a resin is known in the art. Such a semiconductor device keeps expanding and contracting due to heat generated by the operation of the device. In consideration of this, a roughening treatment is applied to the surface of the lead frame to improve adhesion between the lead frame and the resin.

In the case in which the surface of the lead frame is roughened, a solvent component contained in the adhesive (i.e., a die attach paste) used to fix the semiconductor chip to the lead frame easily wets and spreads over the surface of the lead frame. There is a risk that the solvent component reduces adhesion between the lead frame and the resin. Also, the solvent component that has wetted and spread may interfere with a process of wire bonding when wire bonding is performed with respect to an area (e.g., an area on a die pad) contiguous with the area for mounting the semiconductor chip.

It is an object of the present disclosures to provide a lead frame, a method of making a lead frame, and a semiconductor device that can reduce the deterioration of adhesion for the encapsulating resin caused by a solvent component contained in an adhesive, and that can avoid undermining wire bonding.

[Patent Document 1] Japanese Laid-open Patent Publication No. 2017-5149

[Patent Document 2] Japanese Laid-open Patent Publication No. 2008-187045

SUMMARY

According to an aspect of the embodiment, a lead frame includes a first area, situated on a first surface of the lead frame, for mounting a semiconductor chip, and a second area, situated on the first surface of the lead frame, around the first area, wherein the second area includes a roughened area and a less-rough area situated between the roughened area and the first area, the less-rough area having a higher flatness than the roughened area.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, the embodiment will be described with reference to the accompanying drawings. In the specification and drawings, elements having substantially the same functions or configurations are referred to by the same numerals, and a duplicate description thereof may be omitted. In the present disclosures, for the sake of convenience, one side of a lead frame where a semiconductor chip is mounted is referred to as a first side or an upper side, and the opposite side of the lead frame is referred to as a second side or a lower side. A surface (or face) of the lead frame on which the semiconductor chip is mounted is referred to as a first surface (or first face) or an upper surface (or upper face), and a surface (or face) opposite thereto is referred to as a second surface (or second face) or a lower surface (or lower face). It may be noted, however, that the lead frame and a semiconductor device may be used in an upside-down position, or may be placed at any angle. Further, a plan view refers to a view taken in the direction perpendicular to the first surface of the lead frame, and a plane shape refers to the shape of an object as viewed in the direction perpendicular to the first surface of the lead frame.

First Embodiment

Figure 1:
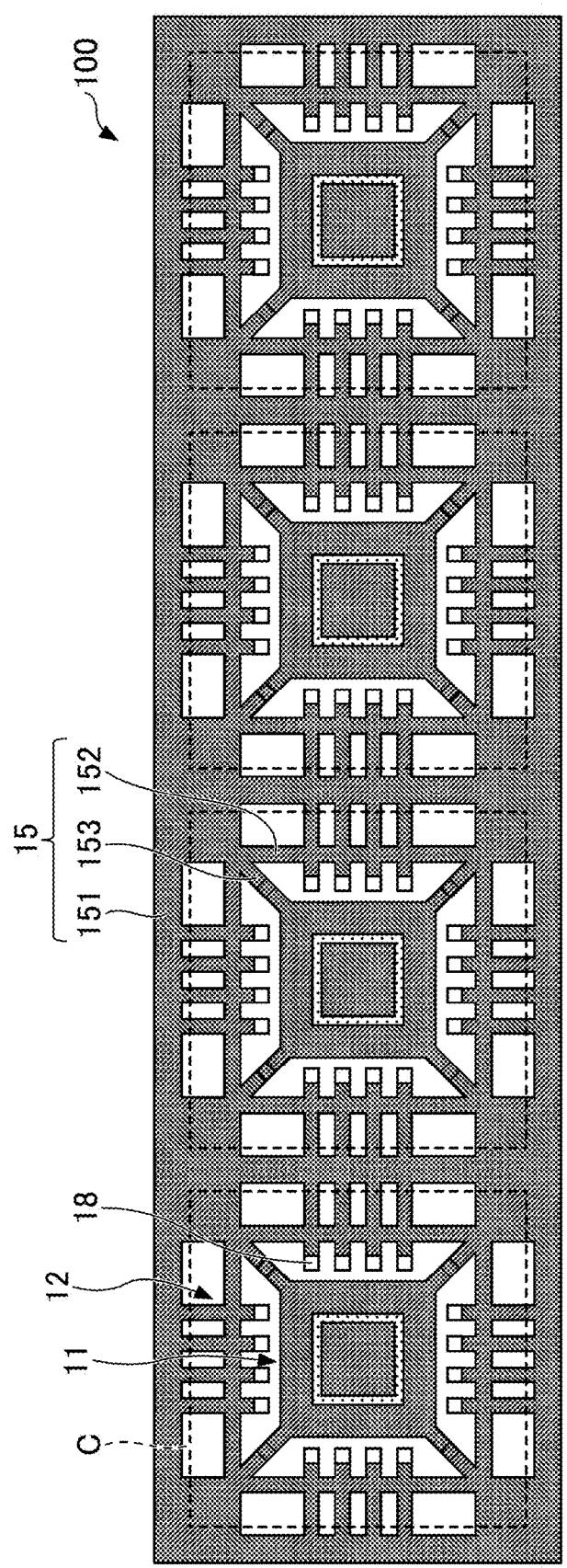
FIG. 1 is a top view of a lead frame according to a first embodiment.
Figure 2:
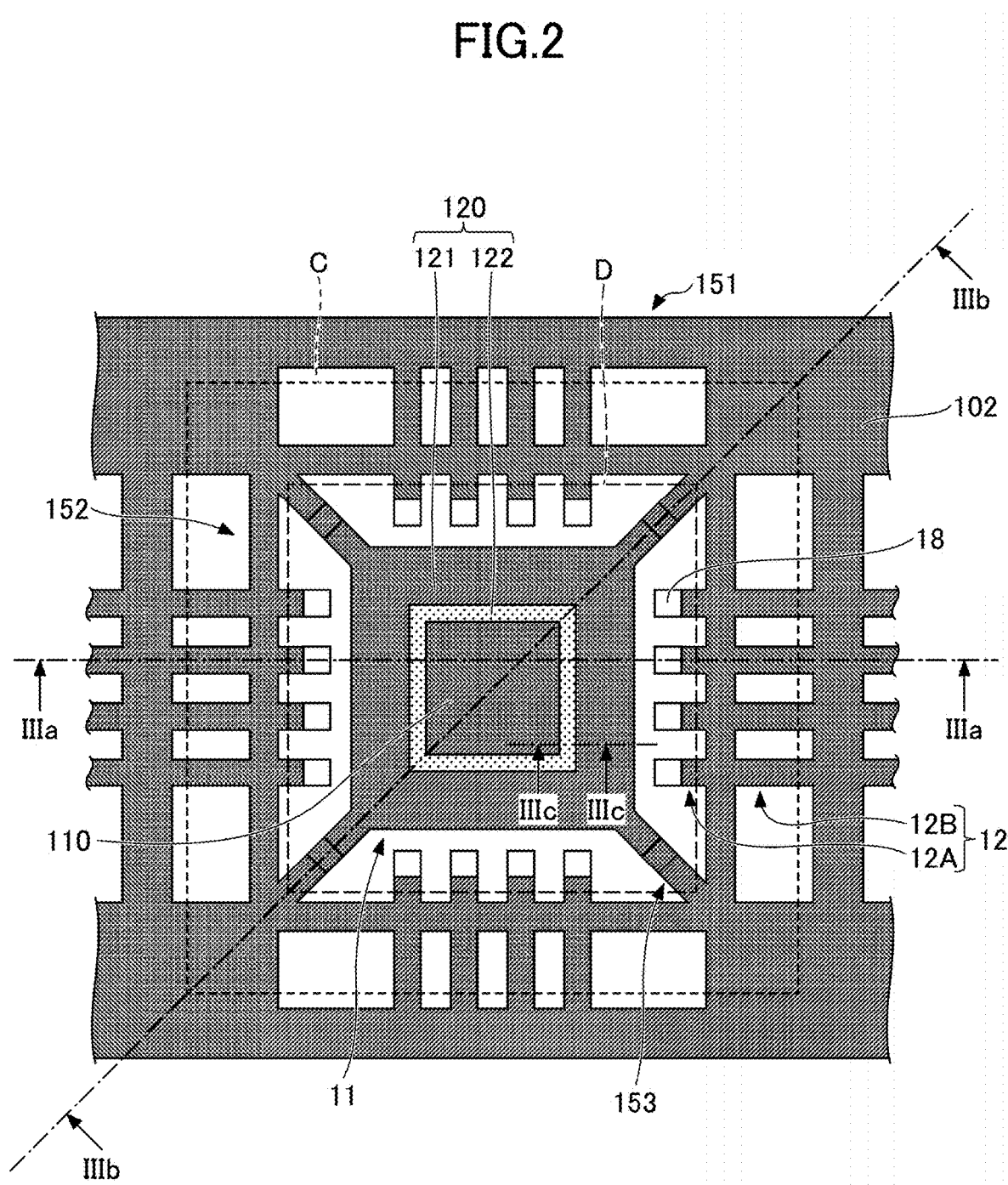
FIG. 2 is an enlarged view of a portion illustrated in FIG. 1.
Figure 3A:
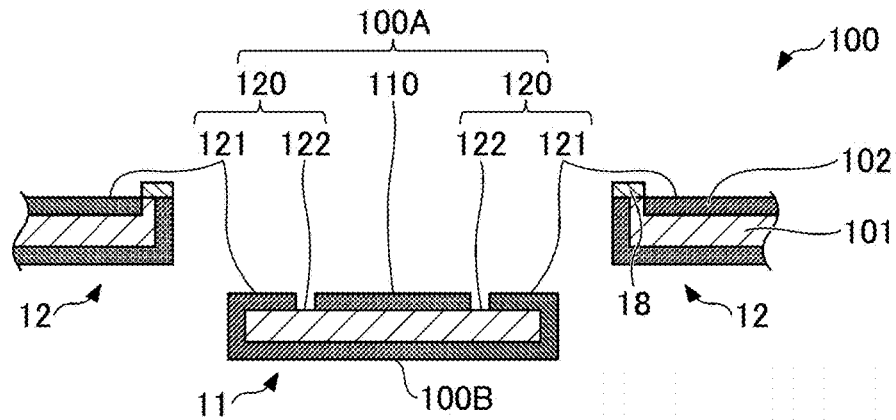
FIGS. 3A through 3C are cross-sectional views of the lead frame according to the first embodiment.
Figure 3B:
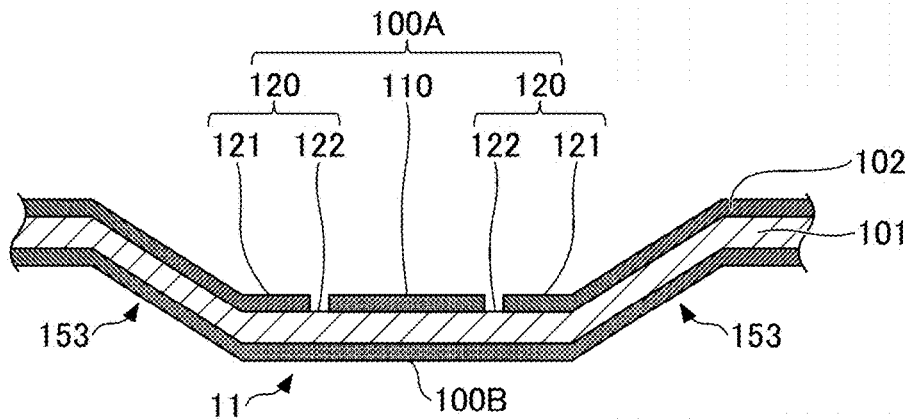
Figure 3C:
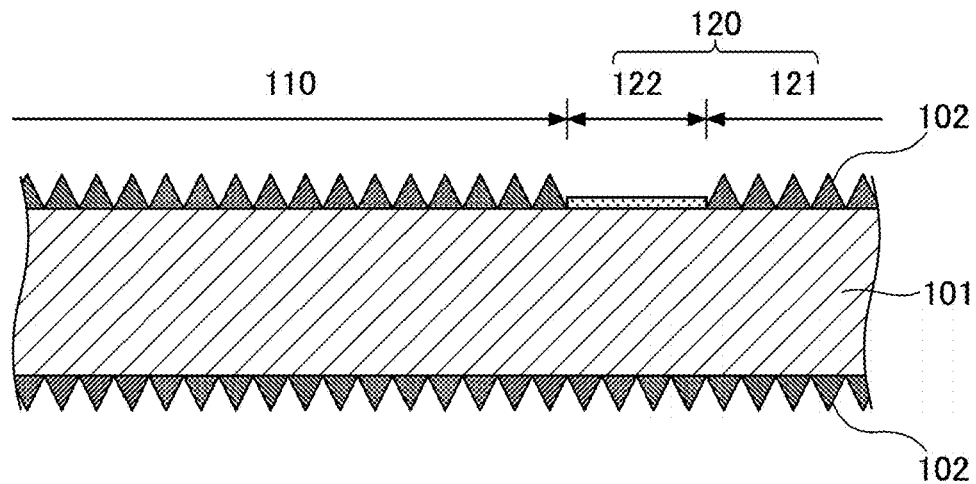

A first embodiment will be described first. The first embodiment is directed to a lead frame.
[Structure of Lead Frame]
The structure of a lead frame will be described first. FIG. 1 is a top view of a lead frame according to a first embodiment. FIG. 2 is an enlarged view of a portion illustrated in FIG. 1. FIGS. 3A through 3C are cross-sectional views of the lead frame according to the first embodiment. FIG. 3A illustrates a cross-sectional view taken along the line IIIa-IIIa in FIG. 1 and FIG. 2. FIG. 3B illustrates a cross-sectional view taken along the line IIIb-IIIb in FIG. 1 and FIG. 2. FIG. 3C illustrates a cross-sectional view taken along the line IIIc-IIIc in FIG. 1 and FIG. 2.

A lead frame 100 according to the first embodiment has a semiconductor chip mounted on the first surface thereof and covered with an encapsulating resin, thereby providing a resultant semiconductor device. The lead frame 100 has roughened surface areas 102 formed in some areas of the surface of a base 101.

As illustrated in FIGS. 1, 2, 3A, 3B, and 3C, the lead frame 100 has a structure constituted by discrete separation areas C that are interconnected via linking parts 15. The linking parts 15 include an outer frame 151, dam bars 152, and support bars 153. The outer frame 151 is provided in the surrounding area of the discrete separation areas C, and includes a frame-shaped portion extending along the outer perimeter of the lead frame 100 and straight-line-shaped portions formed between adjacent discrete separation areas C. The dam bars 152 are arranged in a square shape to enclose a die pad 11 along the outer frame 151 within each discrete separation area C. The support bars 153 are diagonally disposed within each discrete separation area C. The dam bars 152 are disposed outside a resin encapsulation area D that is to be encapsulated with a resin, and the most portions of the support bars 153 are situated inside the resin encapsulation area D.

The four corners of the dam bars 152 are connected to the four corners of the outer frame 151. Each of the dam bars 152 has a plurality of leads 12 attached thereto. Each of the leads 12 includes an inner lead 12A extending from the dam bar 152 toward the die pad 11 and an outer lead 12B extending from the dam bar 152 toward the opposite direction to the inner lead 12A. The support bars 153 each have one end thereof connected to the outer frame 151 and an opposite end thereof connected to a corresponding one of the four corners of the die pad 11 to support the die pad 11.

The upper surface 100A of the lead frame 100 has a first area 110 for mounting a semiconductor chip and a second area 120 for coming in contact with an encapsulating resin around the first area 110. The first area 110 is situated at substantially the center of the die pad 11 and has a rectangular plane shape. The second area 120 is provided around the first area 110 on the die pad 11, on the linking parts 15, and on the leads 12. The second area 120 is an area of the upper surface 100A excluding the first area 110. The die pad 11 may have a plane shape with each side having an approximate length of 5 mm to 15 mm, and the first area 110 may have a plane shape with each side having an approximate length of 4 mm to 13 mm.

Figure 4A:
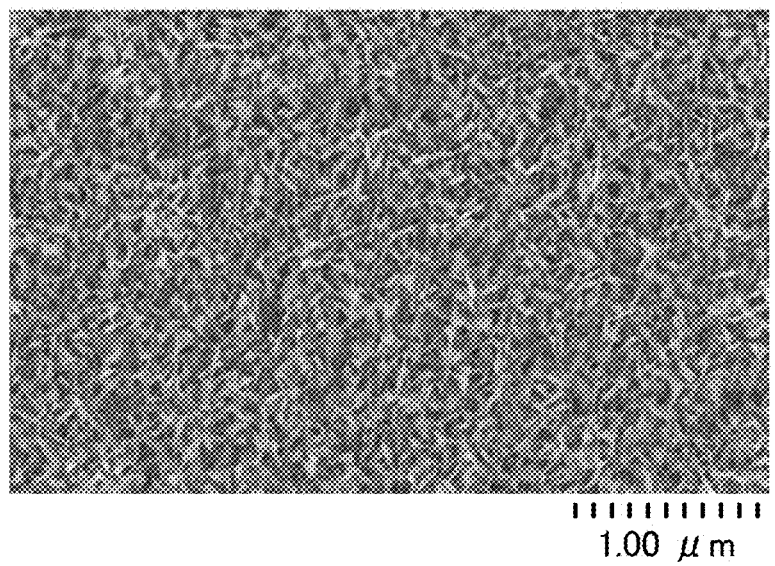
FIGS. 4A and 4B are drawings illustrating examples of images of a roughened area and a less-rough area obtained by a scanning electron microscope.
Figure 4B:
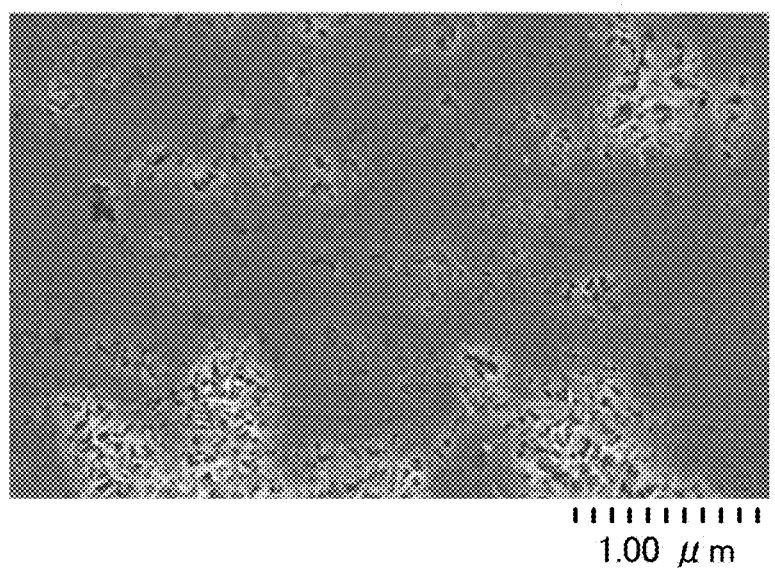

The second area 120 has a roughened area 121 and a less-rough area 122. The less-rough area 122 has a square-frame plane shape, for example, and surrounds the first area 110 in a plan view along the outer perimeter of the first area 110. The roughened area 121 is a portion of the second area 120 excluding the less-rough area 122. In other words, the less-rough area 122 is situated between the roughened area 121 and the first area 110. The width of the less-rough area 122 in plan view may approximately be 0.1 mm to 1.0 mm, for example. A roughened surface 102 is formed in the roughened area 121, and a roughened surface 102 is not formed in the less-rough area 122. The flatness of the less-rough area 122 is greater than that of the roughened area 121. The S ratio of the less-rough area 122 is less than the S ratio of the roughened area 121. For example, the S ratio of the less-rough area 122 is 1.01 to 1.10, and the S ratio of the roughened area 121 is 1.05 to 2.20. FIGS. 4A and 4B are drawings illustrating examples of images of a roughened area and a less-rough area obtained by a scanning electron microscope (SEM). FIG. 4A illustrates an example of an SEM image of a roughened area. FIG. 4B illustrates an example of an SEM image of a less-rough area. The S ratio will be described later. It may be noted that, in FIG. 4A, the roughened area is formed by an oxidation treatment.

The flatness of the lower surface 100B and side surfaces of the discrete separation area C and the linking parts 15 is not limited to particular values, but is preferably comparable with the flatness of the roughened area 121. A roughened surface 102 is preferably formed in the lower surface 100B and side surfaces of the discrete separation area C and the linking parts 15. The flatness of the first area 110 is not limited to a particular value, but is preferably comparable with the flatness of the roughened area 121, for example. A roughened surface 102 is preferably formed in the first area 110.

Each support bar 153 is bent at two points, so that the upper surface of the die pad 11 is positioned below the upper surface of the leads 12. The upper surface of the die pad 11 is substantially parallel to the upper surface of the leads 12.

A plating film 18 is formed on part of the upper surface of the inner lead 12A of each lead 12. The plating film 18 is formed, for example, on a portion to which a metal line is connected by wire bonding. The plating film 18 may be an Ag film, an Au film, an Ni/Au film (i.e., a metal film formed by laminating an Ni film and an Au film in this order), an Ni/Pd/Au film (i.e., a metal film formed by laminating an Ni film, a Pd film, and an Au film in this order), or the like, for example. An alternative configuration may be such that no plating film 18 is formed.

As will be described later in detail, a semiconductor device utilizing the lead frame 100 is manufactured by applying an adhesive (i.e., die-attach paste) such as Ag paste to the first area 110 and mounting a semiconductor chip on the adhesive. The semiconductor chip and the lead frame 100 are then covered with an encapsulating resin.

If the roughened area 121 were contiguous with the first area 110, a solvent component contained in the adhesive would readily wet and spread over the surface of the roughened area 121 due to capillary action. The solvent component wetting and spreading over the roughened area 121 would reduce the adhesion between an encapsulating resin and the roughened area 121. In the present embodiment, a less-rough area 122 having a higher flatness than the roughened area 121 is provided between the first area 110 and the roughened area 121. This arrangement makes it unlikely for the solvent component to wet and spread over the roughened area 121 due to capillary action. As a result, a decrease in the adhesion caused by the solvent component contained in the adhesive is reduced, which results in an excellent adhesion between an encapsulating resin and the roughened area 121.

Figure 5:
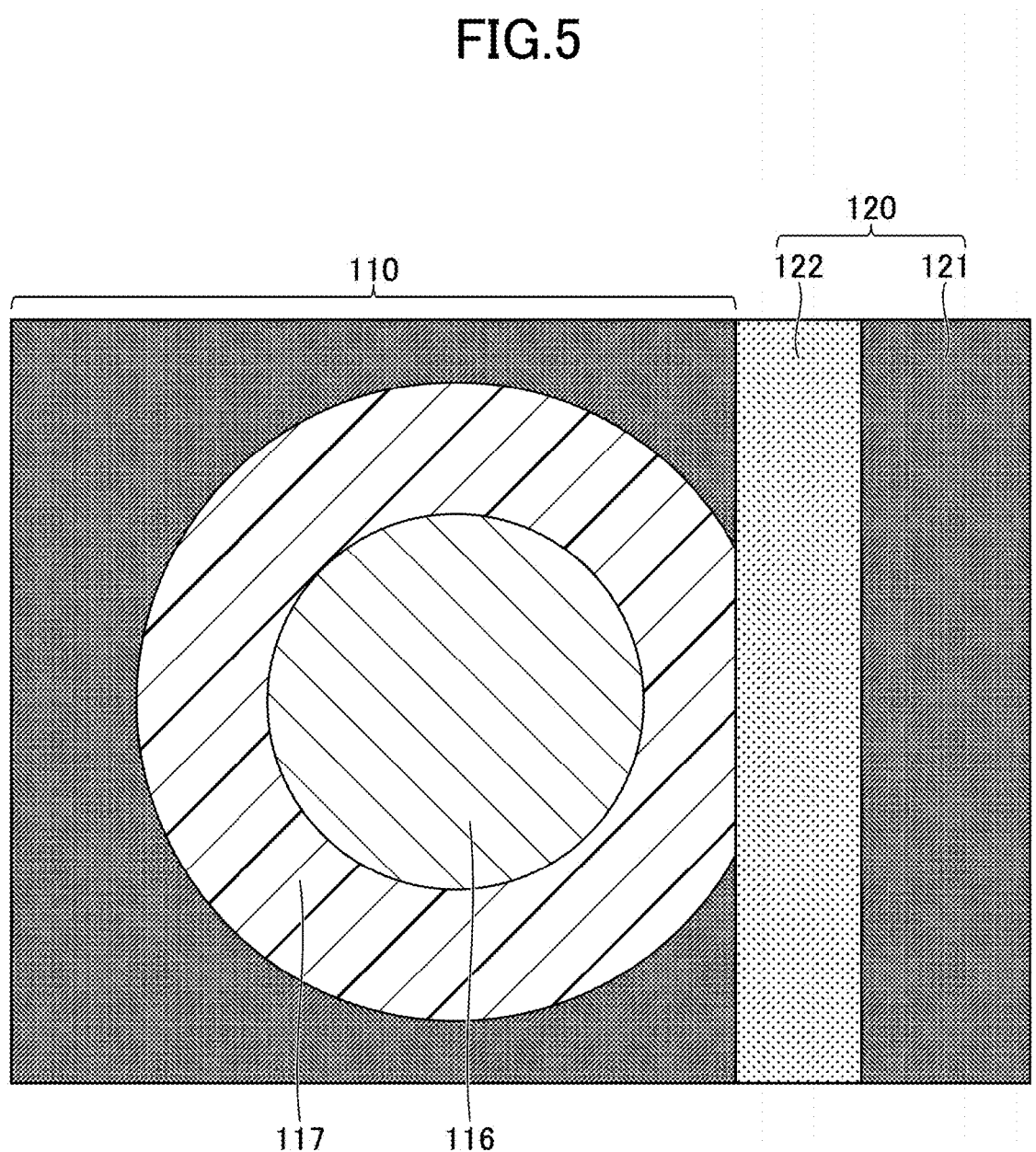
FIG. 5 is a schematic drawing illustrating the way the wetting and spreading of a solvent component is reduced.

FIG. 5 is a schematic drawing illustrating the way the wetting and spreading of a solvent component is reduced. In FIG. 5, Ag paste 116 is applied as an adhesive to a circular area inside the first area 110. The area to which Ag paste 116 is applied is spaced away from the less-rough area 122. The flatness of the first area 110 is comparable with that of the roughened area 121, and the flatness of the first area 110 is less than that of the less-rough area 122. As a result, a solvent component 117 contained in the Ag paste 116 wets and spreads in a circular pattern over the surrounding area of the Ag paste 116 inside the first area 110. However, the solvent component 117 does not cross the border between the first area 110 and the less-rough area 122, thereby being kept inside the first area 110. This arrangement makes it unlikely for the solvent component 117 to wet and spread over the roughened area 121.

As an alternative configuration, it is also conceivable that a hydrophobic organic agent is applied over part of the roughened surface for the purpose of reducing the likelihood of wetting and spreading of a solvent component contained in the adhesive. However, there is a risk that such an organic agent rather adversely reduces adhesion between the lead frame and an encapsulating resin. Further, the use of an organic agent is likely to lead to a cost increase. It may also be cumbersome to apply an organic agent to a desired position in a desired amount. Moreover, an organic agent may deteriorate when subjected to heat treatment. Especially when a plurality of semiconductor chips are mounted on a single die pad 11, multiple heat treatments may be performed, which increases the risk of deterioration.

The reflectivity of visible light is different between the roughened area 121 and the less-rough area 122. This allows the less-rough area 122 to be easily identified by visual inspection or with an optical microscope. On the other hand, applying an organic agent in such an amount as to avoid reducing the adhesion results in the difficulty in determining whether the organic agent is present.

It may be noted that the less-rough area 122 does not have to be continuous along the perimeter of the first area 110. For example, the less-rough area 122 may be discontinuous along the perimeter of the first area 110. Depending on the arrangement of the leads 12, the less-rough area 122 may not be provided in the vicinity of any edge of the first area 110 in a plan view.

Figure 6A:
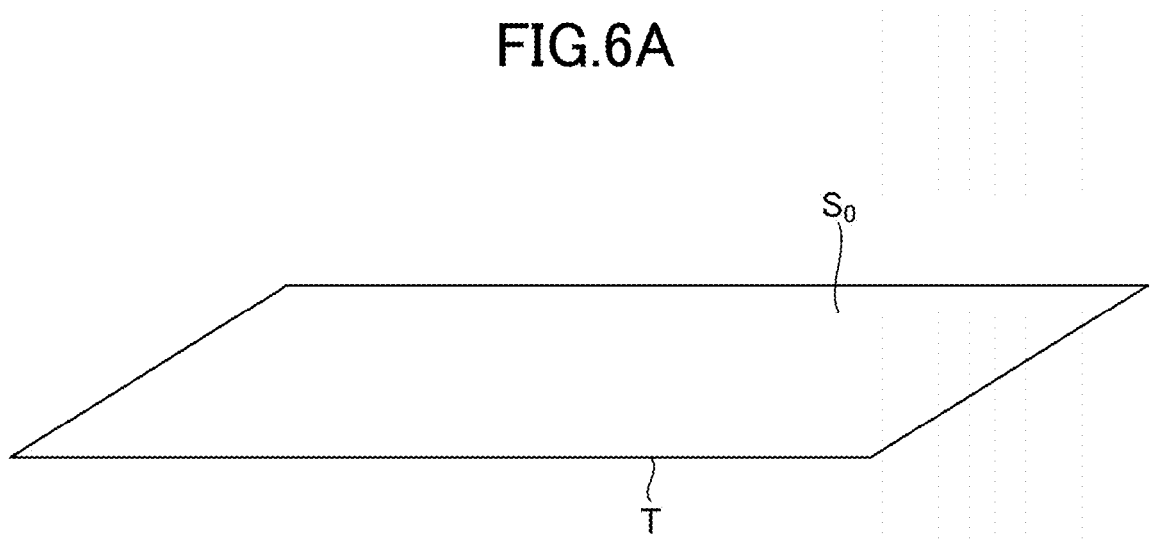
FIGS. 6A and 6B are drawings illustrating a method of calculating the S ratio.
Figure 6B:
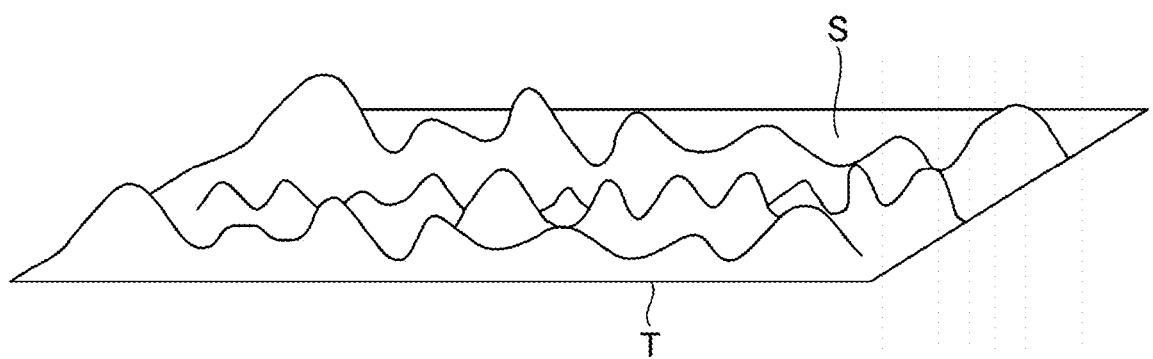

The S ratio will be described in the following. FIGS. 6A and 6B are drawings illustrating a method of calculating the S ratio. As illustrated in FIGS. 6A and 6B, the S ratio is the ratio of an actual surface area S to an area $S_0$ when a region T having the area $S_0$ in a plan view has the actual surface area S. Namely, the S ratio is represented by $S/S_0$.

[Method of Making Lead Frame]

In the following, a method of making the lead frame 100 of the first embodiment will be described. FIGS. 7A and 7B through FIGS. 13A and 13B are drawings illustrating a method of making the lead frame 100 of the first embodiment. FIG. 7A through FIG. 13A are top views. FIG. 7B through FIG. 13B are cross-sectional views taken along the I-I lines in FIG. 7A through FIG. 13A, respectively. FIGS. 8A and 8B through FIGS. 13A and 13B illustrate one of the discrete separation areas C.

Figure 7A:
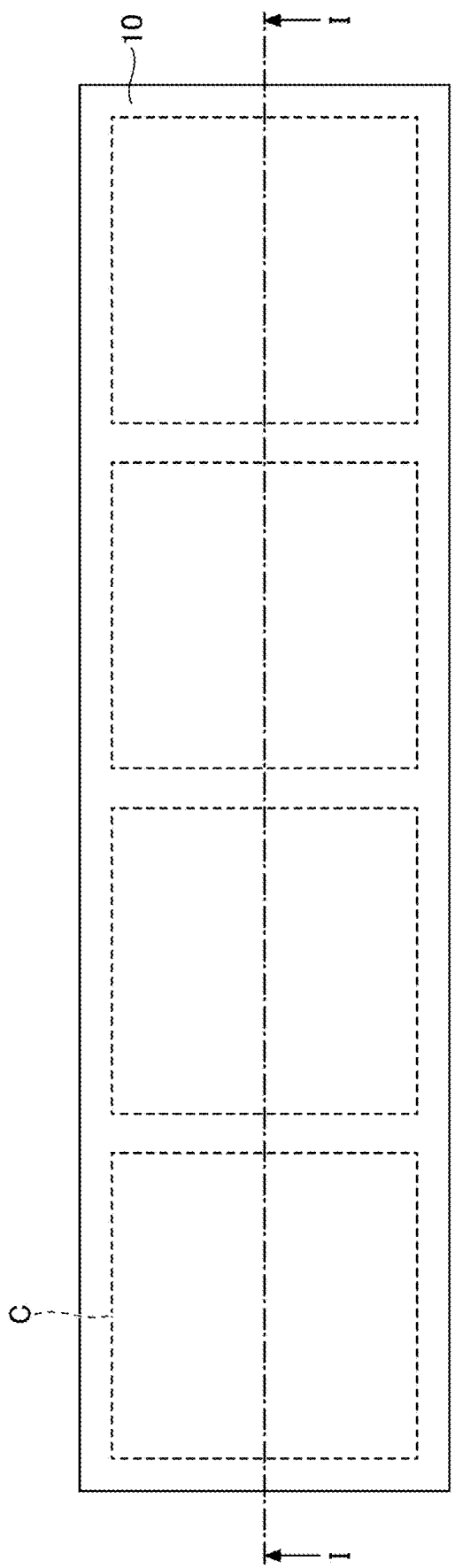
FIGS. 7A and 7B are drawings illustrating a method of making the lead frame of the first embodiment.
Figure 7B:
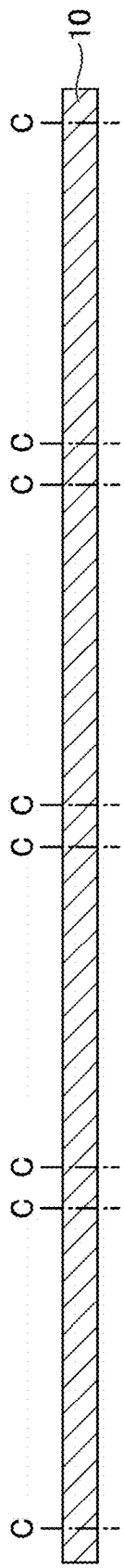

As illustrated in FIGS. 7A and 7B, a metal plate member 10 having a predetermined shape is provided. In the end, the plate member 10 is cut along the cut lines illustrated by dashed lines into separate pieces corresponding to the respective discrete separation areas C. As the material of the plate member 10, Cu, a Cu alloy, a 42 alloy, or the like may be used, for example. The thickness of the plate member 10 may approximately be 100 μm to 200 μm, for example. The S ratio of the surface of the plate member 10 is, for example, approximately 1.00 to 1.03 over the entirety thereof.

Figure 8A:
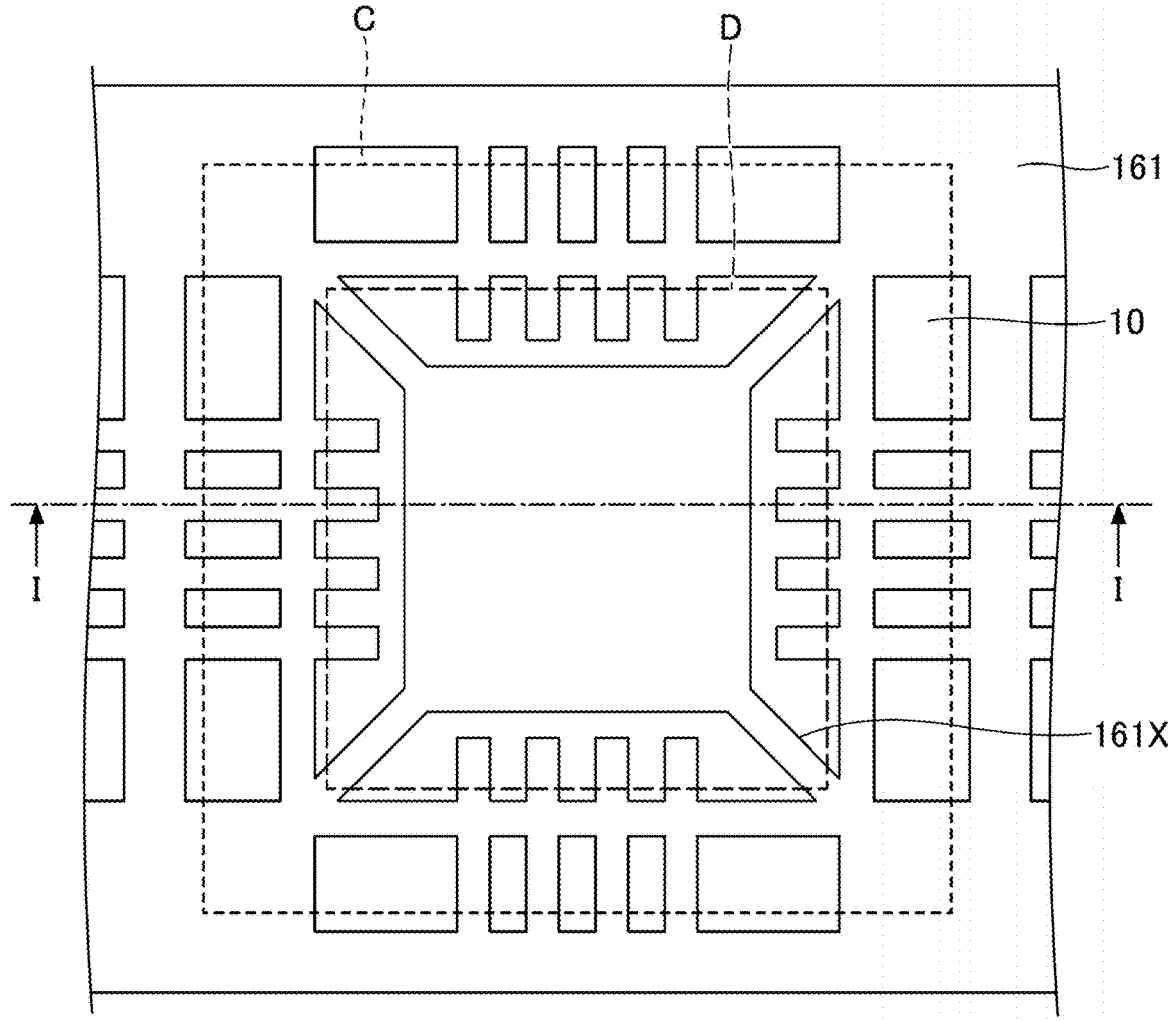
FIGS. 8A and 8B are drawings illustrating the method of making the lead frame of the first embodiment.
Figure 8B:
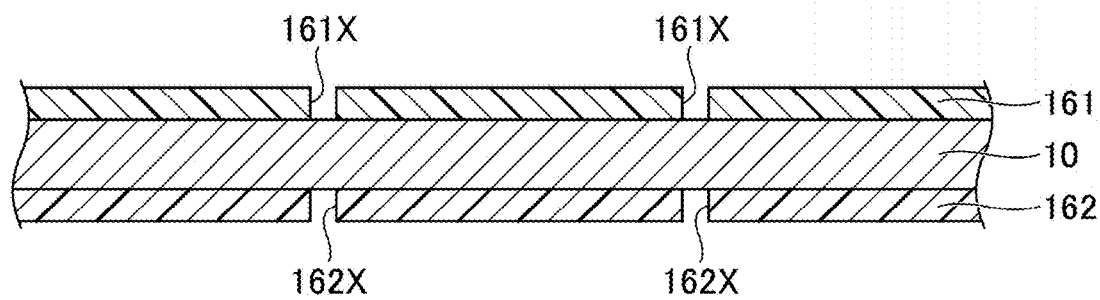

As illustrated in FIGS. 8A and 8B, a photosensitive resist 161 is formed on the upper surface of the plate member 10, and a photosensitive resist 162 is formed on the lower surface of the plate member 10. The resists 161 and 162 are then exposed to light and developed to form openings 161X and 162X at predetermined positions. The openings 161X and 162X, which are provided in the plate member 10 for forming the die pad 11, the leads 12 and the support bars 153, have completely overlapping patterns in a plan view.

Figure 9A:
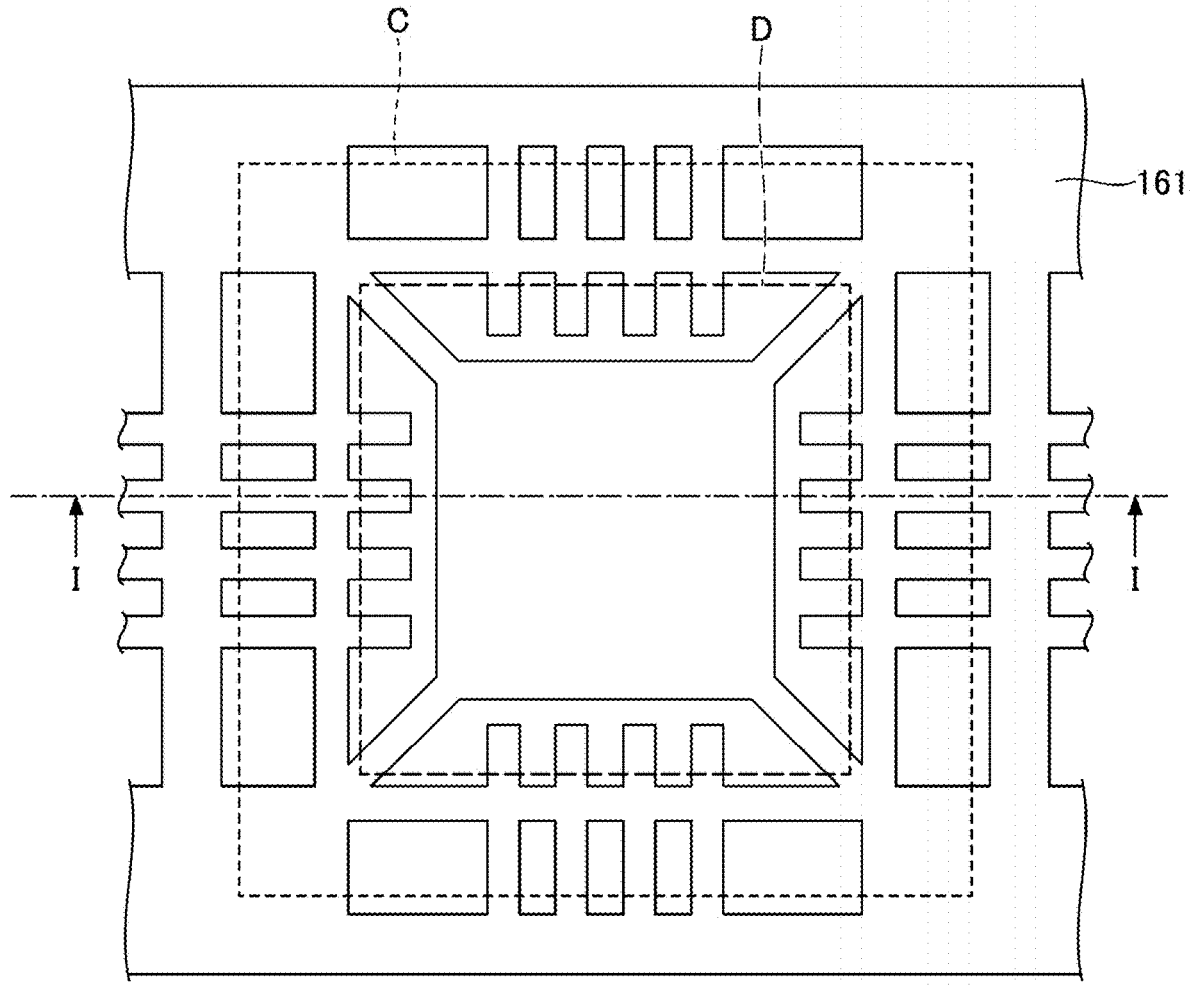
FIGS. 9A and 9B are drawings illustrating the method of making the lead frame of the first embodiment.
Figure 9B:
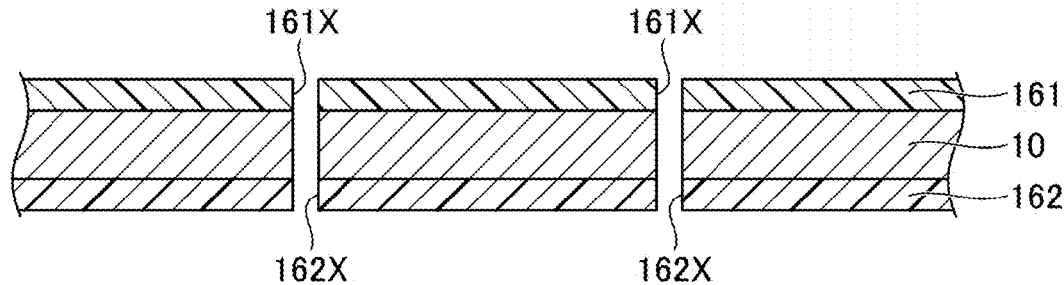

As illustrated in FIGS. 9A and 9B, the resists 161 and 162 are used as etching masks to etch (e.g., wet etch) the plate member 10. By this etching, penetrating holes are formed through the plate member 10 at the positions where the openings 161X and 162X completely overlap each other in a plan view.

Figure 10A:
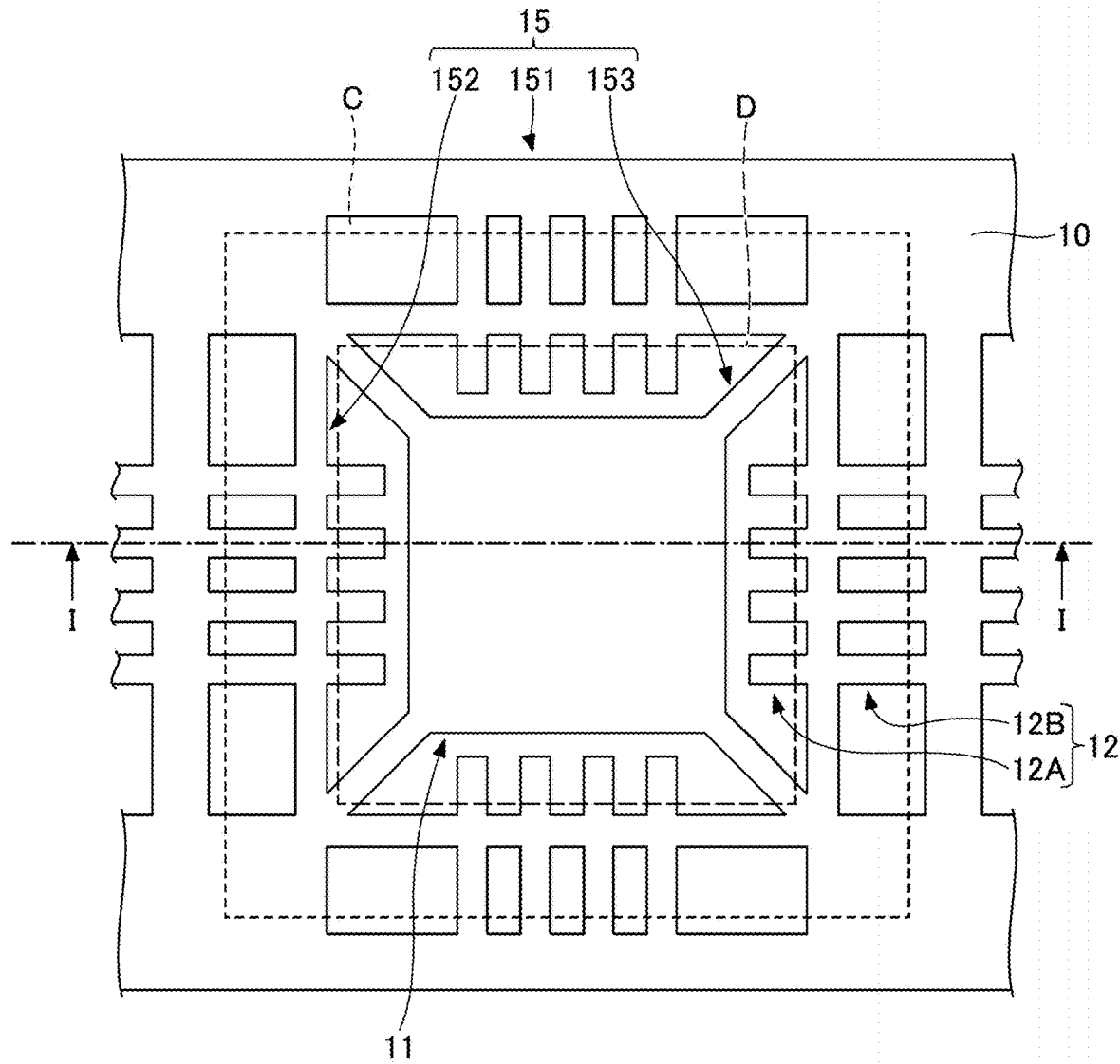
FIGS. 10A and 10B are drawings illustrating the method of making the lead frame of the first embodiment.
Figure 10B:
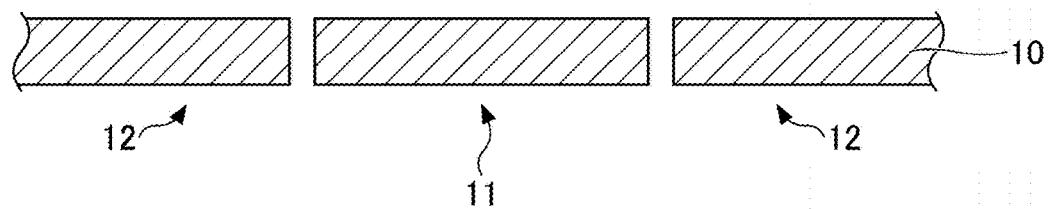

The resists 161 and 162 are then removed as illustrated in FIGS. 10A and 10B. With these processes, a plurality of discrete separation areas C and linking parts 15 are formed in the plate member 10. The linking parts 15 include the outer frame 151, the dam bars 152, and the support bars 153. A plurality of leads 12 connected to the outer frame 151 and the dam bars 152 are also formed in the surrounding area of the die pad 11 in each discrete separation area C. The leads 12 include the inner leads 12A and the outer leads 12B. The upper surface of the plate member 10 has the first area 110 and the second area 120.

Figure 11A:
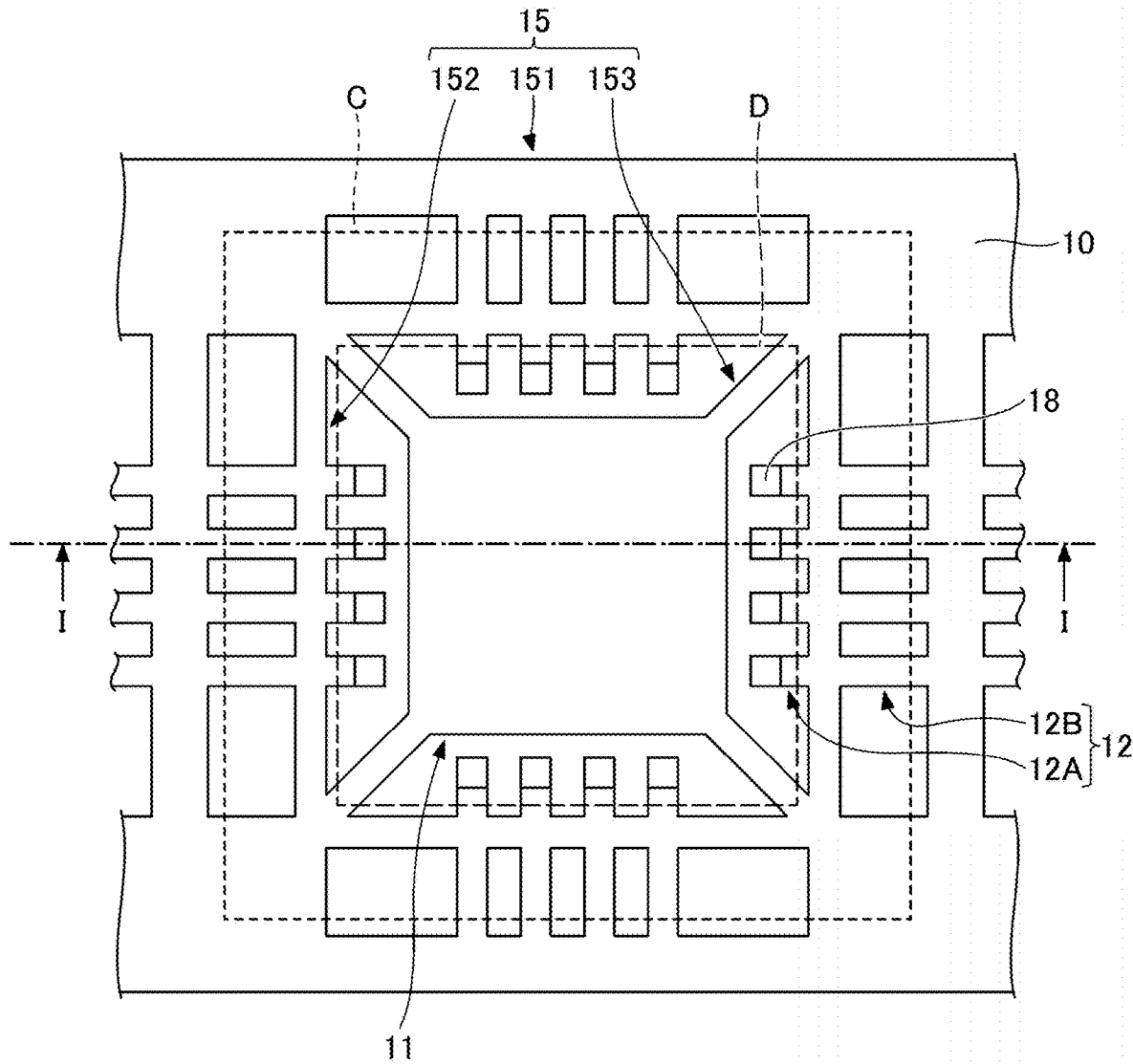
FIGS. 11A and 11B are drawings illustrating the method of making the lead frame of the first embodiment.
Figure 11B:
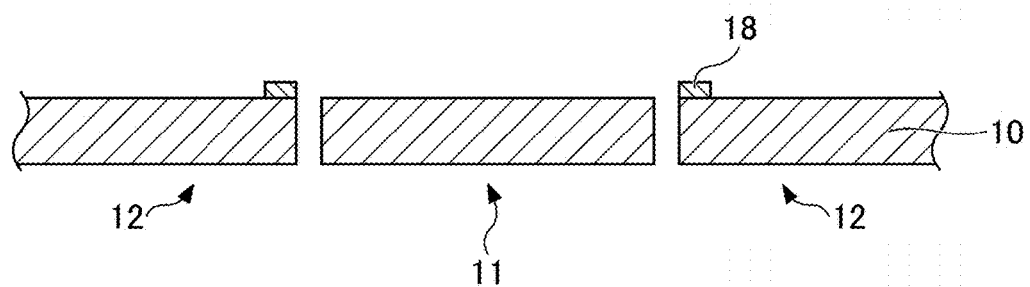

As illustrated in FIGS. 11A and 11B, plated films 18 are formed on a tip part of the upper surface of the inner leads 12A of the leads 12. The plating film 18 is formed, for example, on a portion to which a metal line is connected by wire bonding.

Figure 12A:
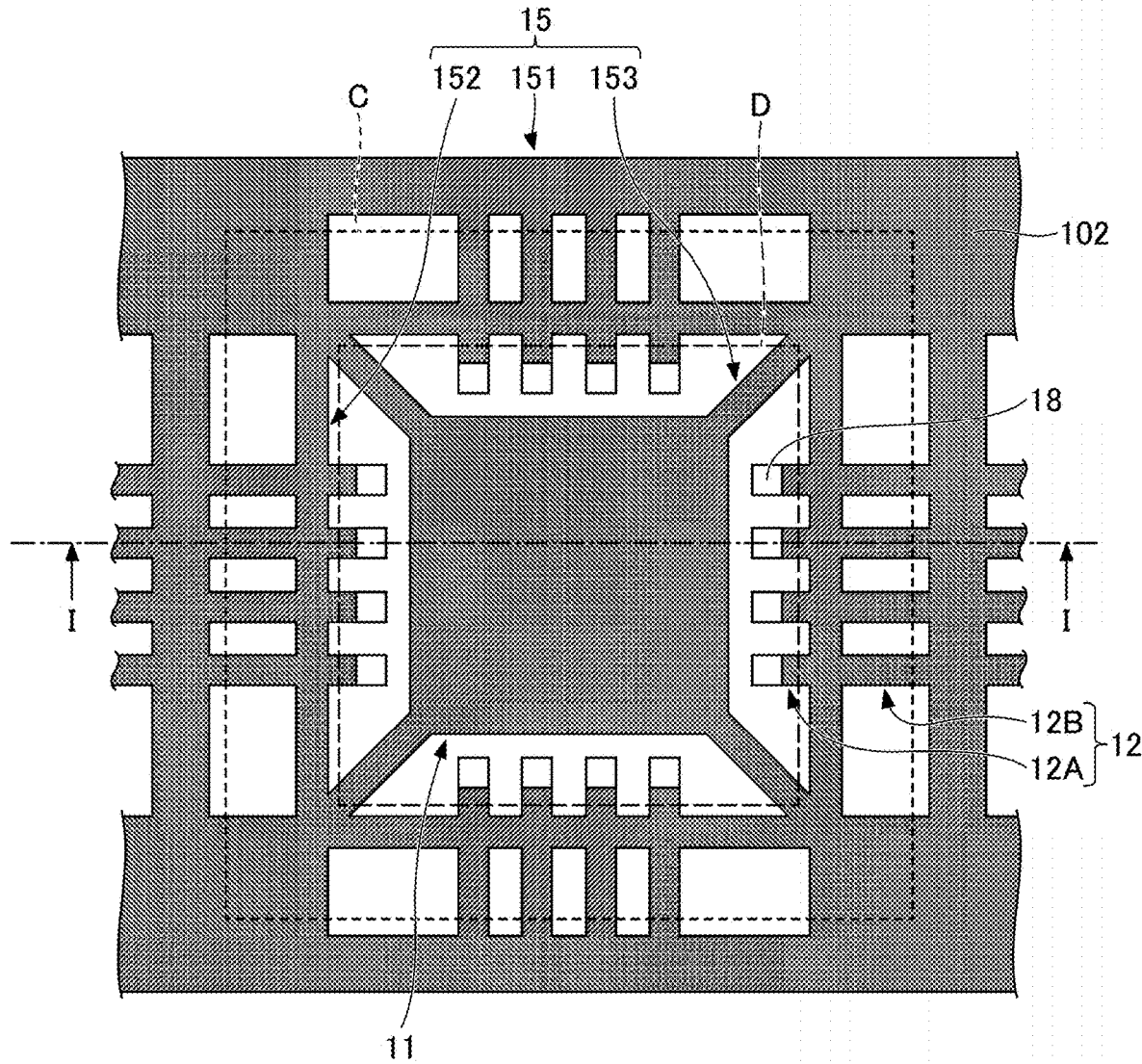
FIGS. 12A and 12B are drawings illustrating the method of making the lead frame of the first embodiment.
Figure 12B:
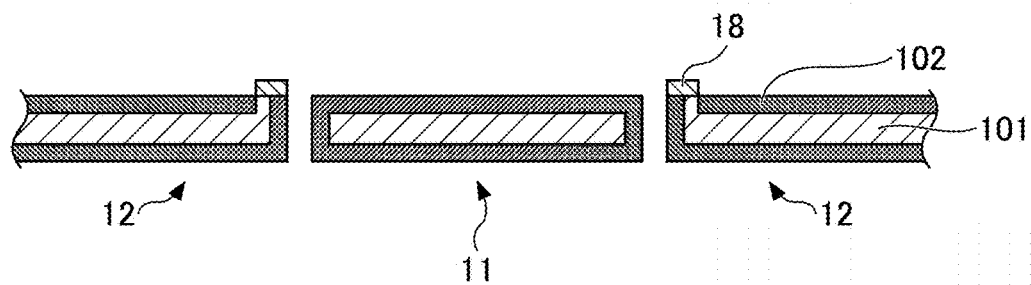

As illustrated in FIGS. 12A and 12B, a roughening treatment is applied to the entire surface of the plate member 10. As a result, a roughened surface 102 is formed on the surface of the plate member 10. The rest of the plate member 10 serves as the base 101. The S ratio of the surface of the roughened surface 102 is, for example, 1.05 to 2.20, depending on the type of roughening treatment. The roughening treatment may alternatively be performed prior to the formation of the plating films 18. The roughening treatment is, for example, performed by an oxidation process, a micro-etching process, a roughening Cu plating process, or a roughening Ni plating process.

In the oxidation process, the plate member 10 made of a Cu or a Cu alloy is anodized in the blackening treatment liquid to form a copper oxide film that contains a hydroxide on the surface and has needle crystals. Namely, Cu of the plate member 10 is anodized. The S ratio of the roughened surface 102 formed by the oxidation process is, for example, 1.05 to 1.50.

In the micro-etching process, an etchant containing sulfuric acid and hydrogen peroxide with an added inhibitor is used to etch the surface of the plate member 10 made of Cu or a Cu alloy. In this etching process, the inhibitor adsorbs to the surface of the plate member 10, thereby causing the dissolution rate of the surface to vary. As a result, areas where dissolution proceeds faster are depressed, and areas where dissolution proceeds slower bulge. The S ratio of the roughened surface 102 formed by the micro-etching process is, for example, 1.05 to 1.50.

In the roughening Cu plating process, plating is performed by cathode electrolysis on the surface of the plate member 10 using a copper sulfate-based plating liquid while depositing coarse crystals locally in high-current-density areas. The S ratio of the roughened surface 102 formed by the roughening Cu plating process is, for example, 1.20 to 2.20.

In the roughening Ni plating process, Ni plating, Pd plating, and Au plating are sequentially performed by cathode electrolysis, and an acid plating bath containing a halogen such as Ni bromide is used for the nickel plating. Use of the halogen-containing acid plating bath allows larger Ni crystal grains to be obtained than the use of an acid plating bath containing no halogen. The S ratio of the roughened surface 102 formed by the roughening Ni plating process is, for example, 1.20 to 1.80.

Figure 14C:
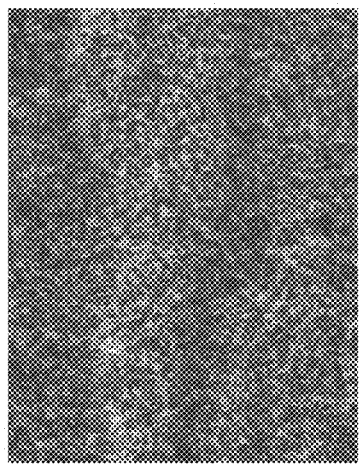
FIGS. 14A through 14E are drawings illustrating examples of images of roughened areas obtained by a scanning electron microscope.
Figure 14B:
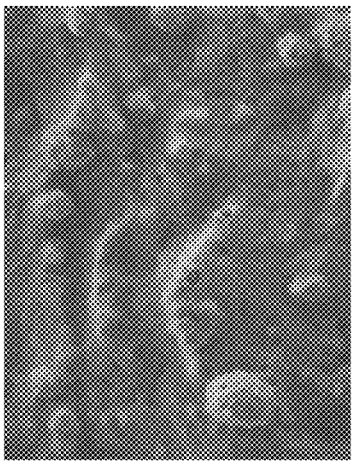
Figure 14E:
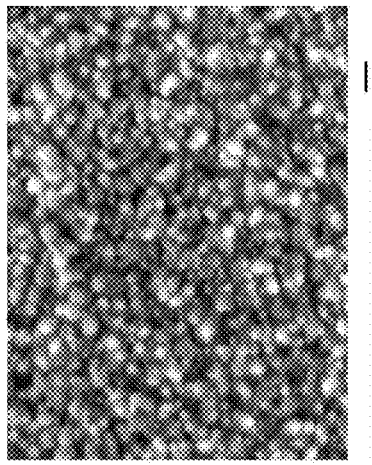
Figure 14A:
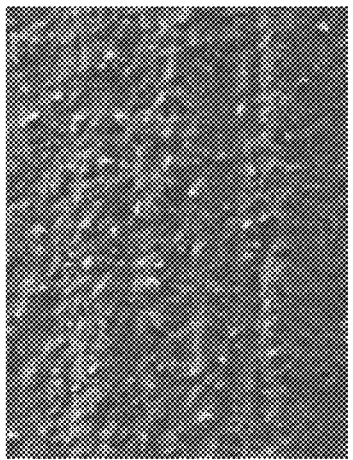
Figure 14D:
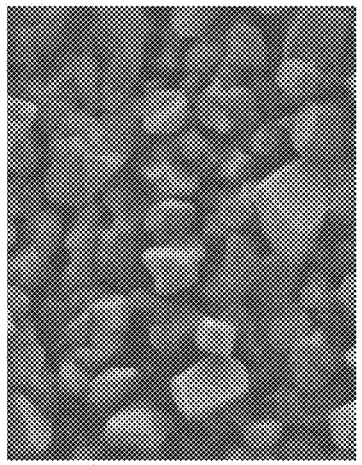

FIGS. 14A through 14E are drawings illustrating examples of SEM images of roughened areas. FIG. 14A illustrates an SEM image of a Cu material that is not subjected to a roughening treatment. FIG. 14B illustrates an example of an SEM image of a roughened area obtained by a micro-etching process. FIG. 14C illustrates an example of an SEM image of a roughened area obtained by an oxidation process. FIG. 14D illustrates an example of an SEM image of a roughened area obtained by a roughening Cu plating process. FIG. 14E illustrates an example of an SEM image of a roughened area obtained by a roughening Ni plating process. In the sample illustrated in FIG. 14E, a Pd plating process and an Au plating process are performed after the roughened Ni plating process, but the thickness of the Pd plating and the Au plating is extremely thin, ranging from 0.005 μm to 0.05 μm. Because of this, the Pd plating and Au plating are formed along the surface roughened by the roughening Ni plating, so that the roughness of the resultant roughened surface is substantially equal to the roughness of the surface roughened by the roughening Ni plating.

Figure 13A:
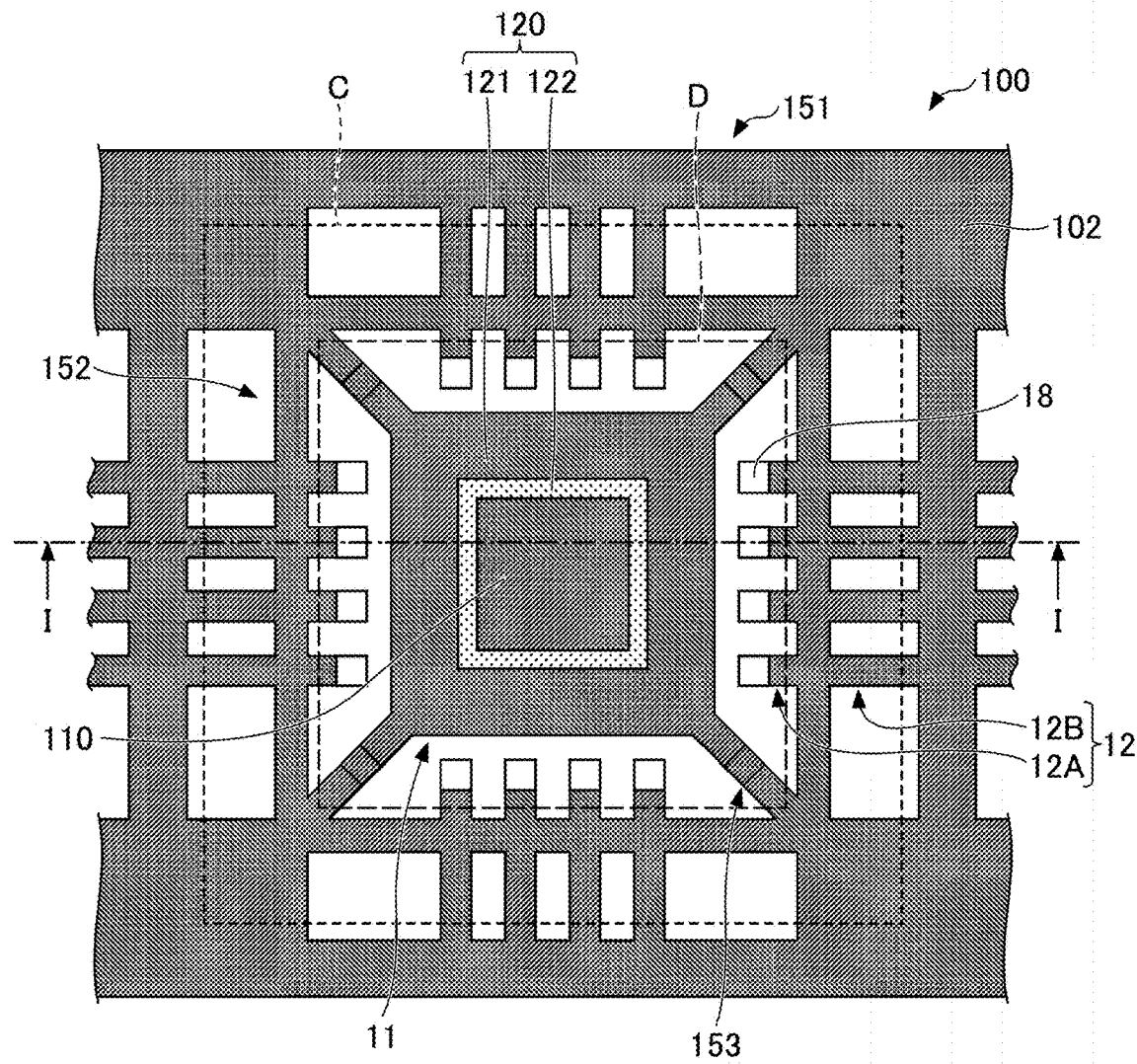
FIGS. 13A and 13B are drawings illustrating the method of making the lead frame of the first embodiment.
Figure 13B:
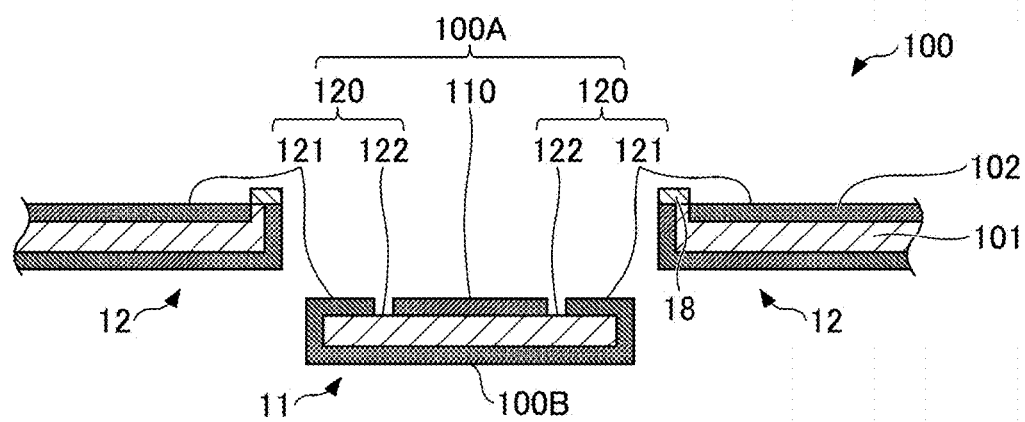

After the roughening process, as illustrated in FIGS. 13A and 13B, a mold (not illustrated) is used to bend the support bars 153, and also to press part of the second area 120 to perform a roughness reducing process that reduces roughness. As a result, the portion of the roughened surface 102 which is pressed by the mold is flattened, so that the resultant flatness of the pressed portion is higher than that of the non-pressed portion, which results in the formation of the less-rough area 122 in the second area 120. The non-pressed portion of the second area 120 serves as the roughened area 121. The roughened surface 102 is crushed (i.e., flattened) to an approximate depth of, for example, 1 μm to 2 μm. The S ratio of the less-rough area 122 is, for example, 1.01 to 1.10. The crushing of the roughened surface 102 is sometimes referred to as a coining process.

In the manner described above, the lead frame 100 according to the first embodiment is manufactured.

It is not necessary to perform the process of bending the support bars 153 and the process of reducing the roughness of the second area 120 at the same time. The process of reducing the roughness of the second area 120 may be performed prior to the process of bending the support bars 153, or the process of bending the support bars 153 may be performed prior to the process of reducing the roughness of the second area 120.

The upper surface of the die pad 11 and the upper surface of the lead 12 may alternatively be set coplanar, without performing the process of bending the support bars 153.

Second Embodiment

In the following, a second embodiment will be described. A second embodiment relates to a semiconductor device made by using the lead frame 100 of the first embodiment.

[Structure of Semiconductor Device]

Figure 15:
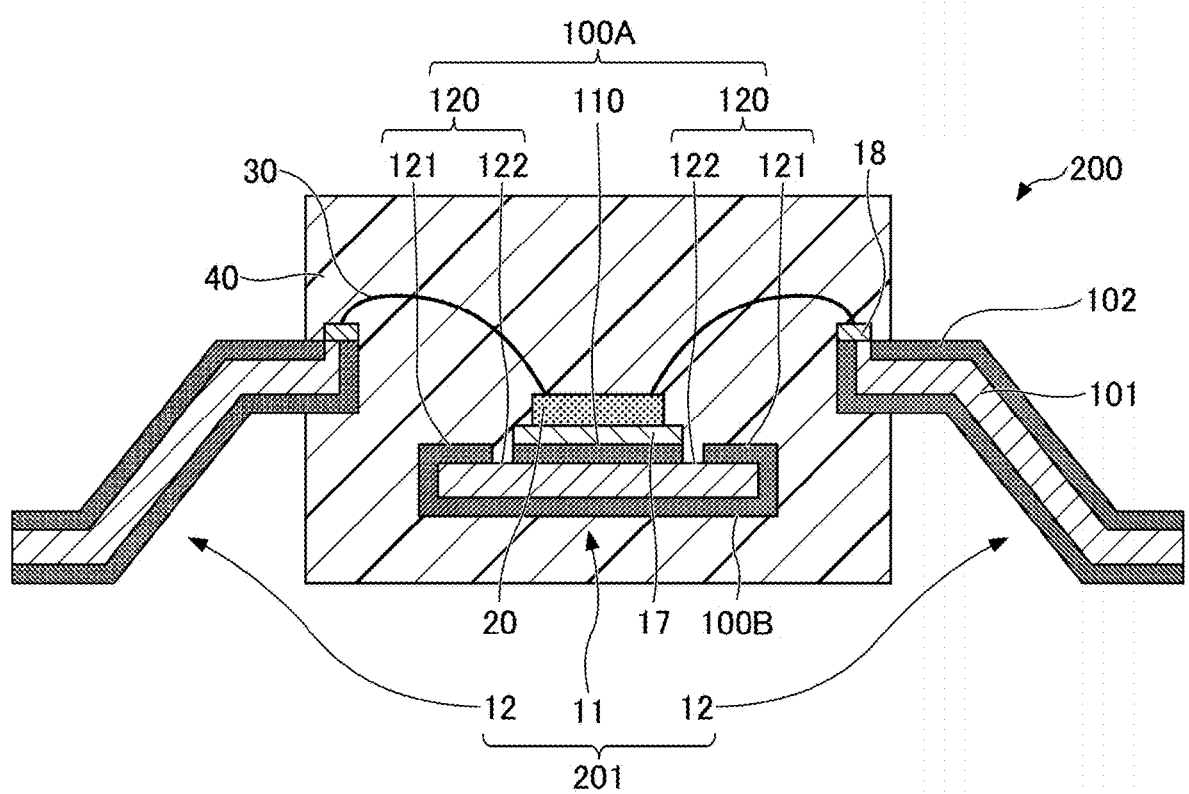
FIG. 15 is a cross-sectional view illustrating an example of a semiconductor device according to a second embodiment.

In the following, the structure of a semiconductor device will be described. FIG. 15 is a cross-sectional view illustrating an example of a semiconductor device according to the second embodiment;

As illustrated in FIG. 15, a semiconductor device 200 of the second embodiment includes a lead frame 201, a semiconductor chip 20, metal lines (bonding wires) 30, and a resin part 40 (i.e., encapsulating resin).

The lead frame 201 is an inner portion of the discrete separation area C of the lead frame 100, and includes the die pad 11 (i.e., chip mounting area) for mounting the semiconductor chip 20, the leads 12 (i.e., terminals), and the support bars 153. The leads 12 are electrically isolated from the die pad 11, and are arranged around the die pad 11 at a constant pitch in a plan view. It may be noted that the leads 12 may not be disposed all around the die pad 11 along the four sides thereof, and may be disposed only on two opposite sides of the die pad 11. The width of the leads 12 may approximately be 0.2 mm, for example. The pitch of the leads 12 may approximately be 0.4 mm, for example.

The semiconductor chip 20 is mounted with its face up on the die pad 11. The semiconductor chip 20 may be mounted (i.e., die bonded) on the die pad 11 via an adhesive 17 such as Ag paste, for example. Electrode terminals formed on the upper face of the semiconductor chip 20 are electrically coupled (i.e., wire-bonded) to the plating films 18 formed on the upper surface of the leads 12 through metal lines 30 that are made of gold, copper or the like.

The resin part 40 is provided in the resin encapsulation area D to encapsulate the lead frame 201, the semiconductor chip 20, and the metal lines 30. The outer leads 12B (see FIG. 2) of the leads 12 project from the resin part 40. Namely, the resin part 40 encapsulates the semiconductor chip 20 and the like such that the outer leads 12B of the leads 12 are exposed. The outer leads 12B of leads 12 serve as external connection terminals. The outer leads 12B of the leads 12 protruding from the resin part 40 are bent at two places, for example. The inner leads 12A (see FIG. 2) of the leads 12 are covered with the resin part 40. The resin part 40 may be made of mold resin or the like that is an epoxy resin inclusive of a filler, for example.

Intrusion of moisture into the resin part of the semiconductor device (i.e., at the interface between the resin part and the lead frame) may create the risk that the moisture in the resin part rapidly expands and vaporizes during a reflow process when mounting the semiconductor device on a substrate, thereby causing cracks in the resin part. Occurrence of such cracks or the like may destroy the semiconductor device.

In the semiconductor device 200 according to the second embodiment, the lead frame 201 is formed as the lead frame 100, so that the lead frame 201 has the roughened area 121 having excellent adhesion to the resin part 40. This arrangement reduces the likelihood of moisture intrusion described above, thereby preventing the semiconductor device 200 from being readily destroyed.

[Method of Making Semiconductor Device]

In the following, a description will be given of a method of making the semiconductor device 200 of the second embodiment. FIGS. 16A and 16B through FIGS. 19A and 19B are drawings illustrating a method of making the semiconductor device 200 of the second embodiment. FIG. 16A through FIG. 19A are top views. FIG. 16B through FIG. 19B are cross-sectional views taken along the I-I lines in FIG. 16A through FIG. 19A, respectively.

Figure 16A:
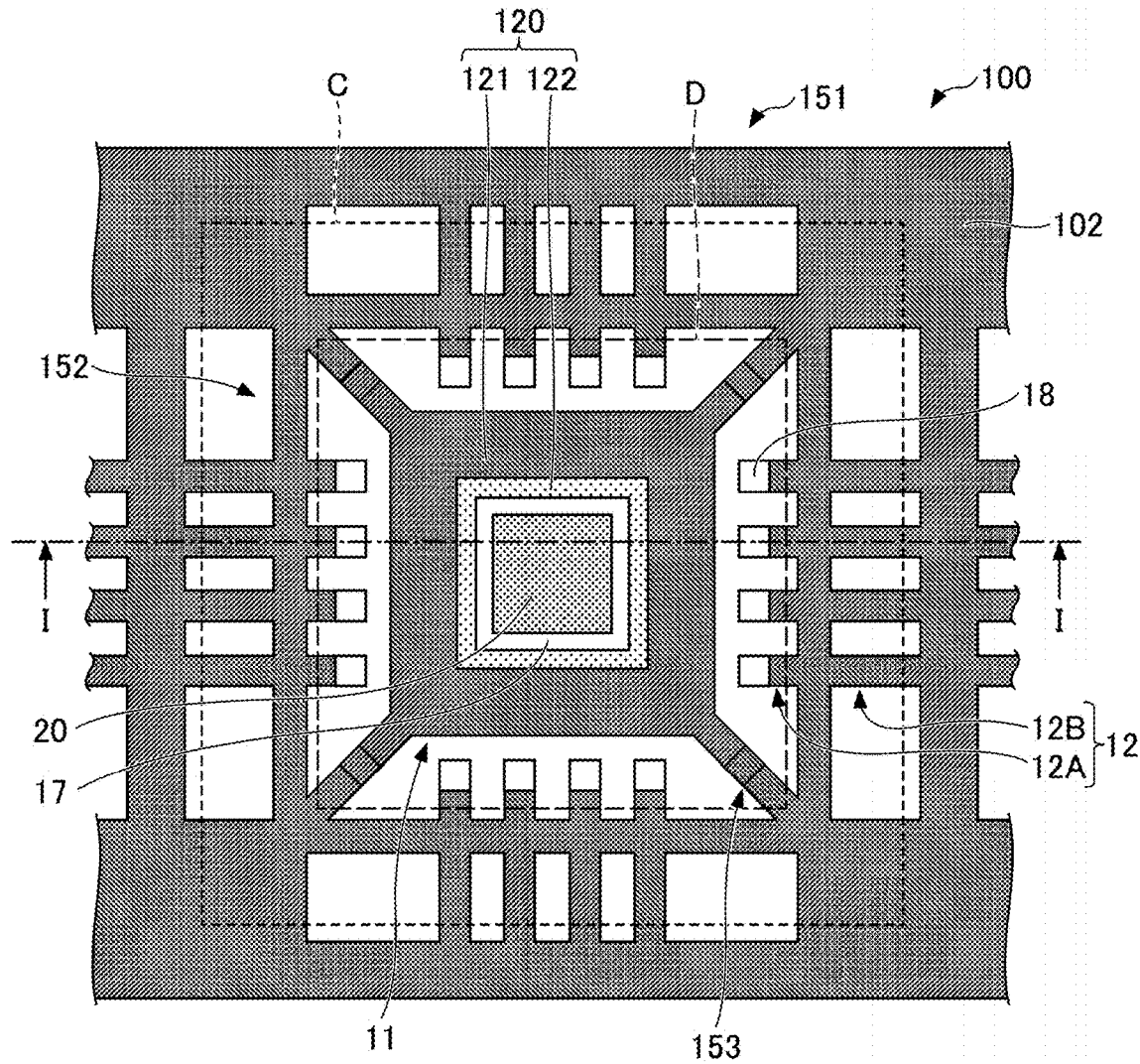
FIGS. 16A and 16B are drawings illustrating a method of making the semiconductor device of the second embodiment.
Figure 16B:
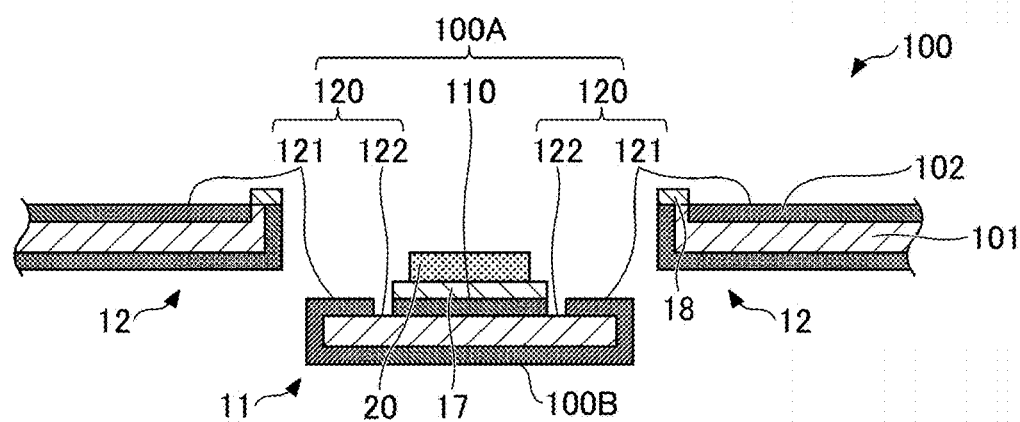

As illustrated in FIGS. 16A and 16B, an adhesive 17 is applied to the first area 110 of the die pad 11 of each discrete separation area C, and the semiconductor chip 20 is mounted with its face up on the adhesive 17, followed by curing the adhesive 17 by heating. With this, the semiconductor chip 20 is secured on the die pad 11. The adhesive 17 used herein may include a resin such as an epoxy-based resin or a polyimide-based resin, for example. Alternatively, the adhesive 17 used herein may further contain a conductive filler such as silver or copper in the resin noted above.

Figure 20:
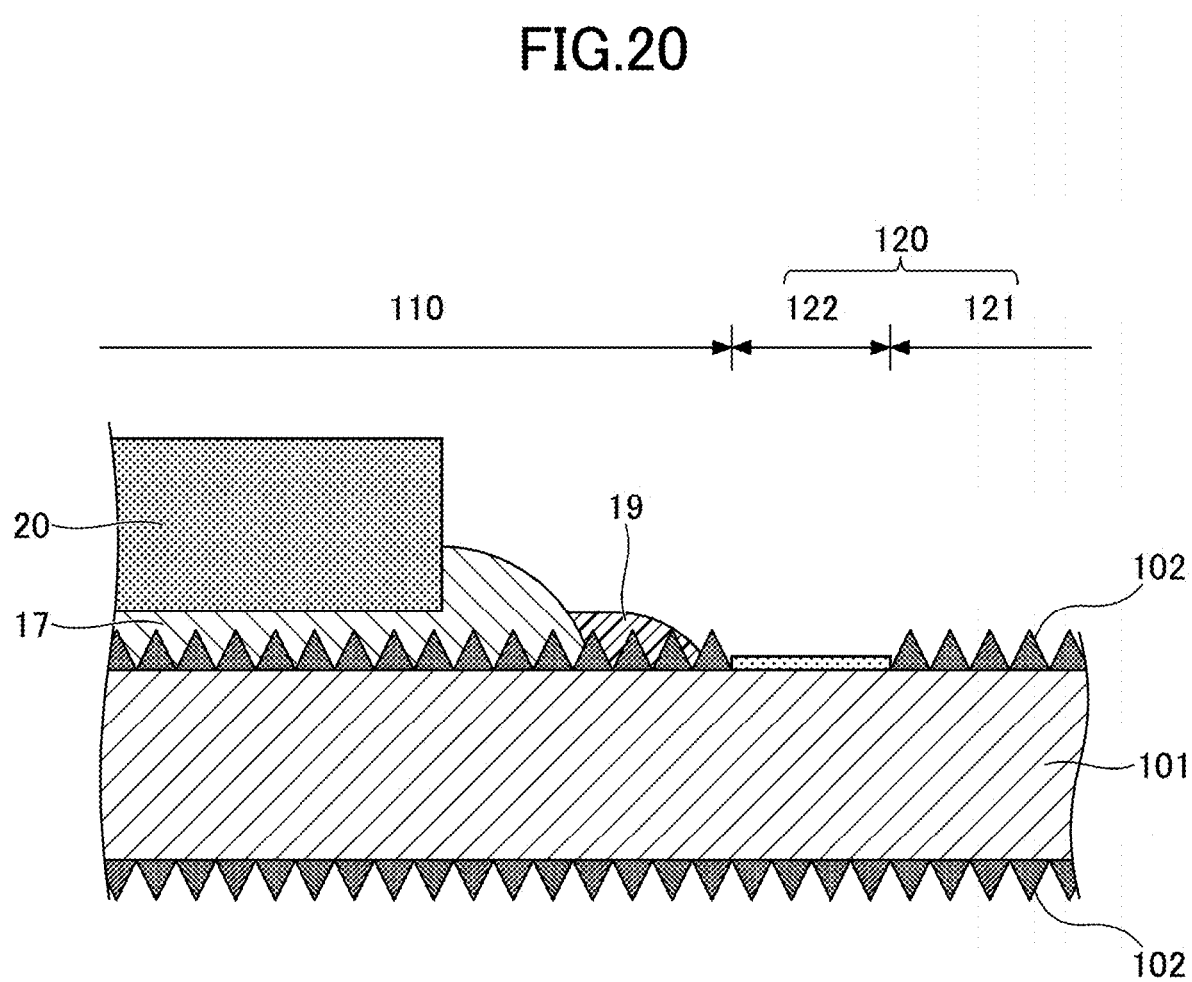
FIG. 20 is a cross-sectional view illustrating the behavior of a solvent components contained in an adhesive.

In the following, the behavior of a solvent component included in the adhesive 17 will be described. FIG. 20 is a cross-sectional view illustrating the behavior of a solvent components contained in the adhesive 17. Since the first area 110 is a roughened surface, a solvent component 19 contained in the adhesive 17 wets and spreads within the first area 110 due to capillary action, as illustrated in FIG. 20. However, the second area 120 has the less-rough area 122 that is formed in the surrounding area of the first area 110 along the outer perimeter of the first area 110 in a plan view. Because of this arrangement, the solvent component 19 does not wet and spread over the less-rough area 122, and remains within the first area 110. This makes it unlikely for the solvent component 19 to wet and spread over the roughened area 121.

Figure 17A:
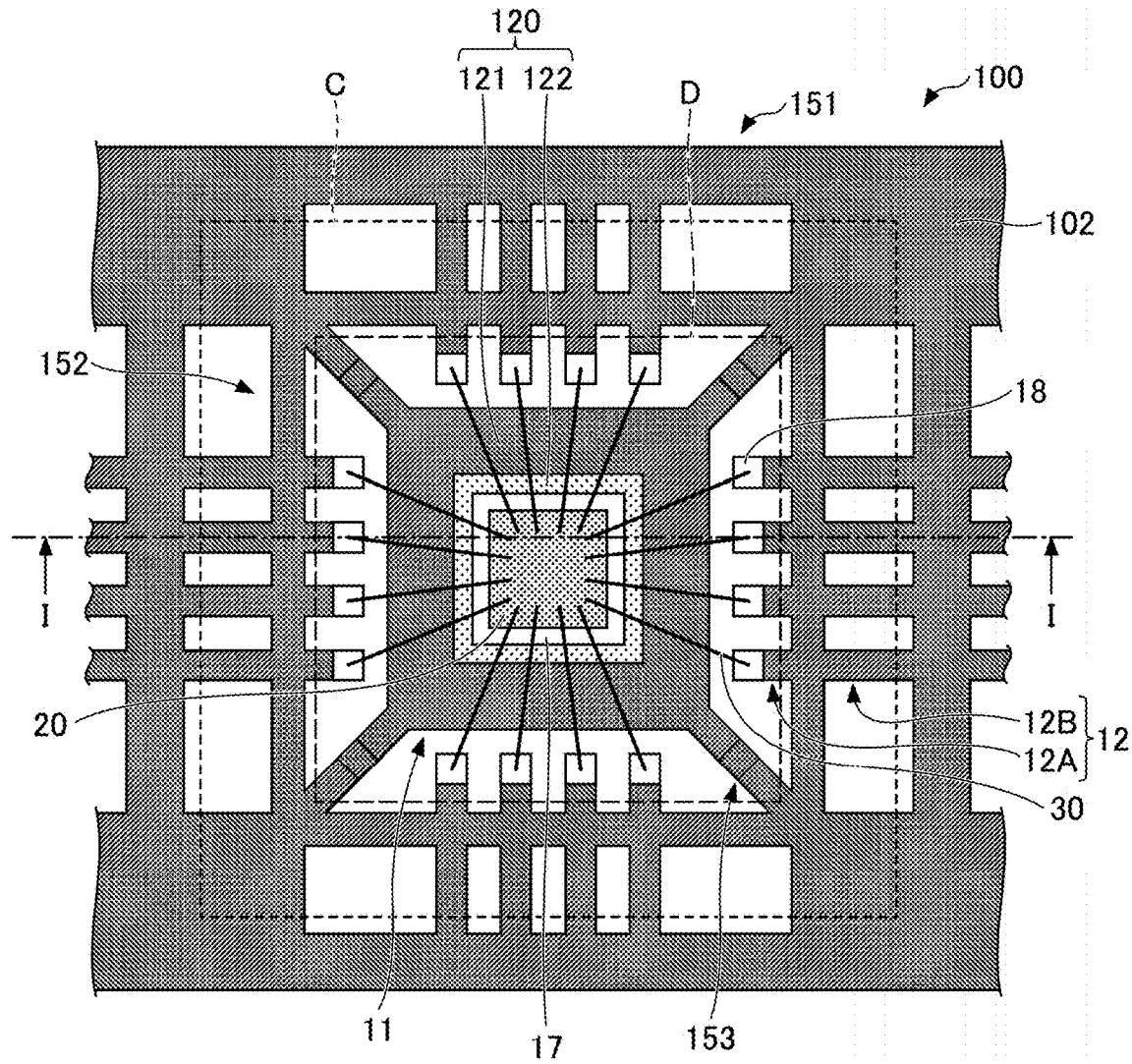
FIGS. 17A and 17B are drawings illustrating the method of making the semiconductor device of the second embodiment.
Figure 17B:
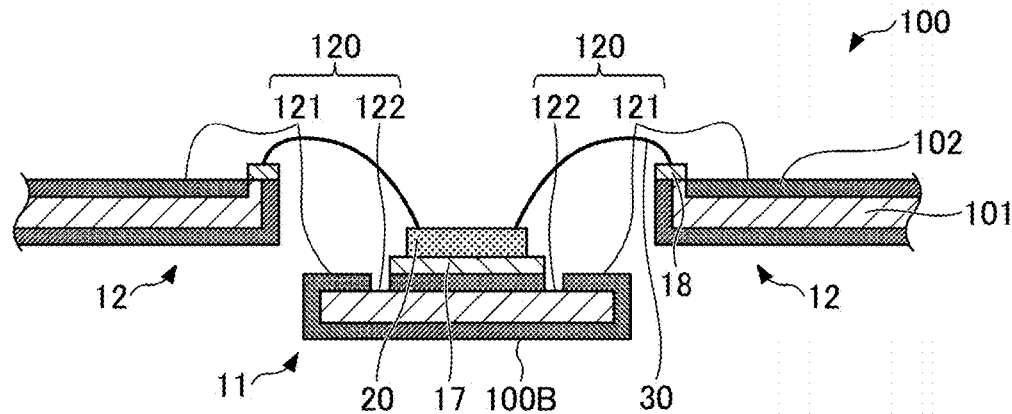

After securing the semiconductor chip 20, the electrode terminals formed on the upper surface of the semiconductor chip 20 are electrically connected to the plating films 18 formed on the upper surface of the leads 12 via the metal lines 30, as illustrated in FIGS. 17A and 17B. The metal lines 30 may connect the electrode terminals of the semiconductor chip 20 and the plating films 18 by wire bonding, for example.

Figure 18A:
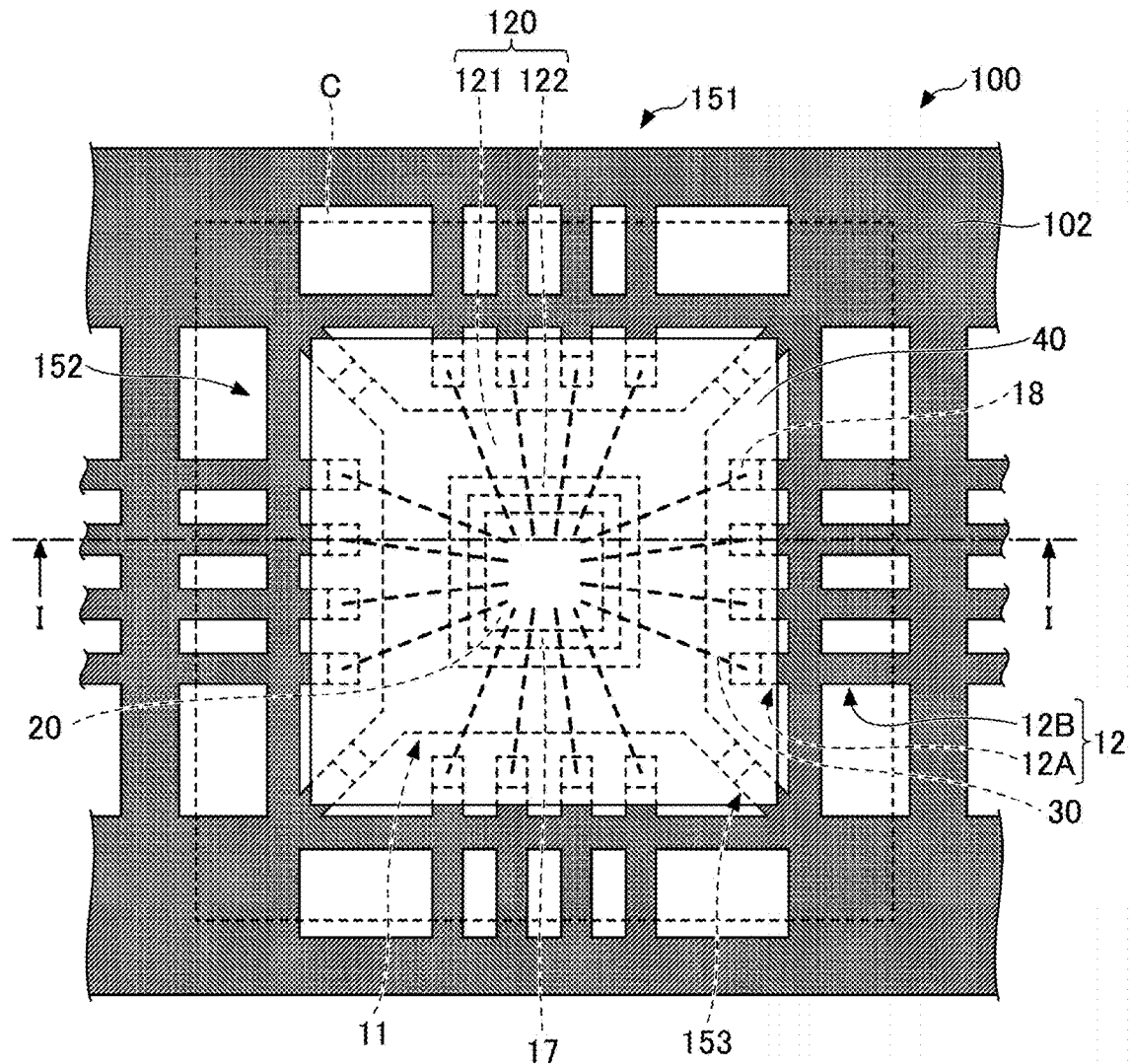
FIGS. 18A and 18B are drawings illustrating the method of making the semiconductor device of the second embodiment.
Figure 18B:
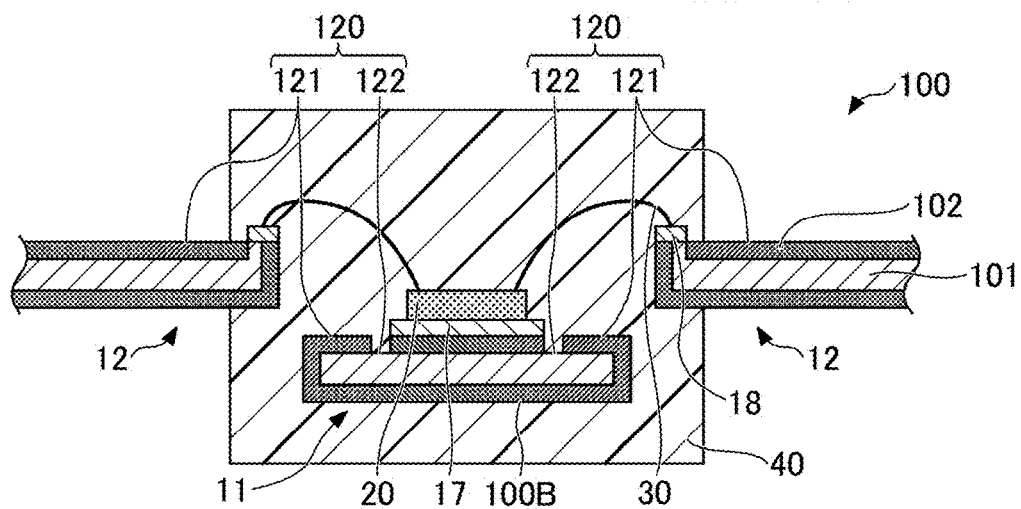

Next, as illustrated in FIGS. 18A and 18B, the resin part 40 for encapsulating the lead frame 100, the semiconductor chip 20, and the metal lines 30 is formed in the resin encapsulation area D. The resin part 40 may be made of a mold resin or the like that is an epoxy resin containing a filler, for example. The resin part 40 may be formed by use of a transfer mold method or a compression mold method, for example.

Figure 19A:
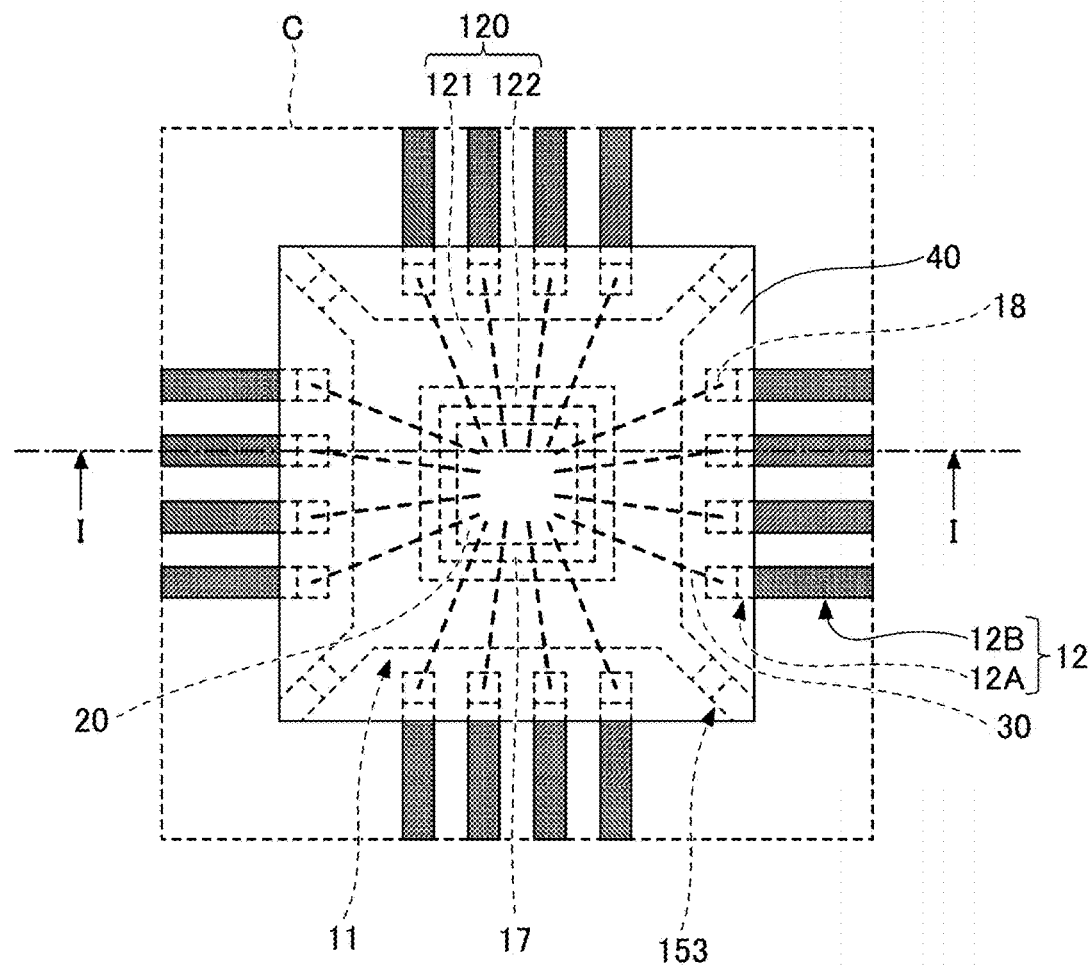
FIGS. 19A and 19B are drawings illustrating a method of making the semiconductor device of the second embodiment.
Figure 19B:
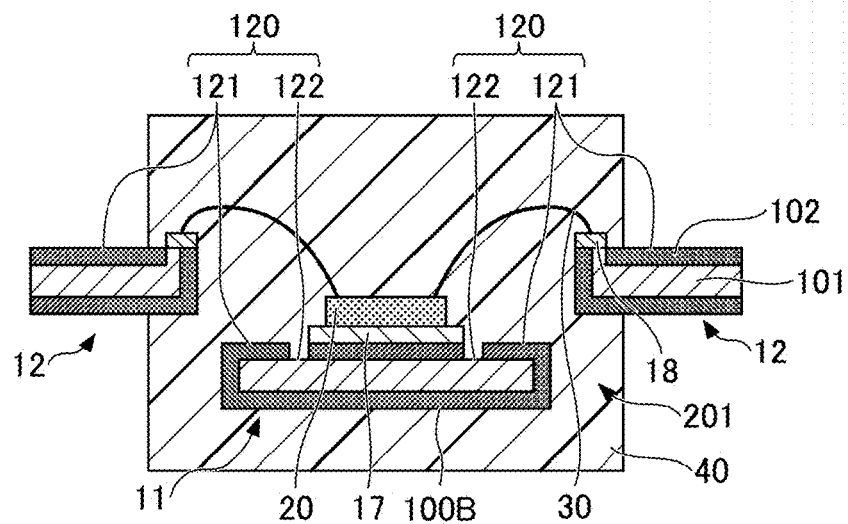

As illustrated in FIGS. 19A and 19B, the portions of the dam bars 152 between the leads 12 are removed, and the portions of the dam bars 152 between the leads 12 and the support bars 153 are removed. Further, the portions connecting the outer leads 12B and the outer frame 151 and the portions connecting the support bars 153 and the outer frame 151 are cut off, thereby separating each discrete separation area C. For each separated structure, a lead frame 201 is obtained from the lead frame 100. Thereafter, the portions of the leads 12 protruding from the resin part 40 are mechanically bent, thereby producing a plurality of semiconductor devices 200 having a final form (see FIG. 15).

<Variation of Second Embodiment>

Figure 21:
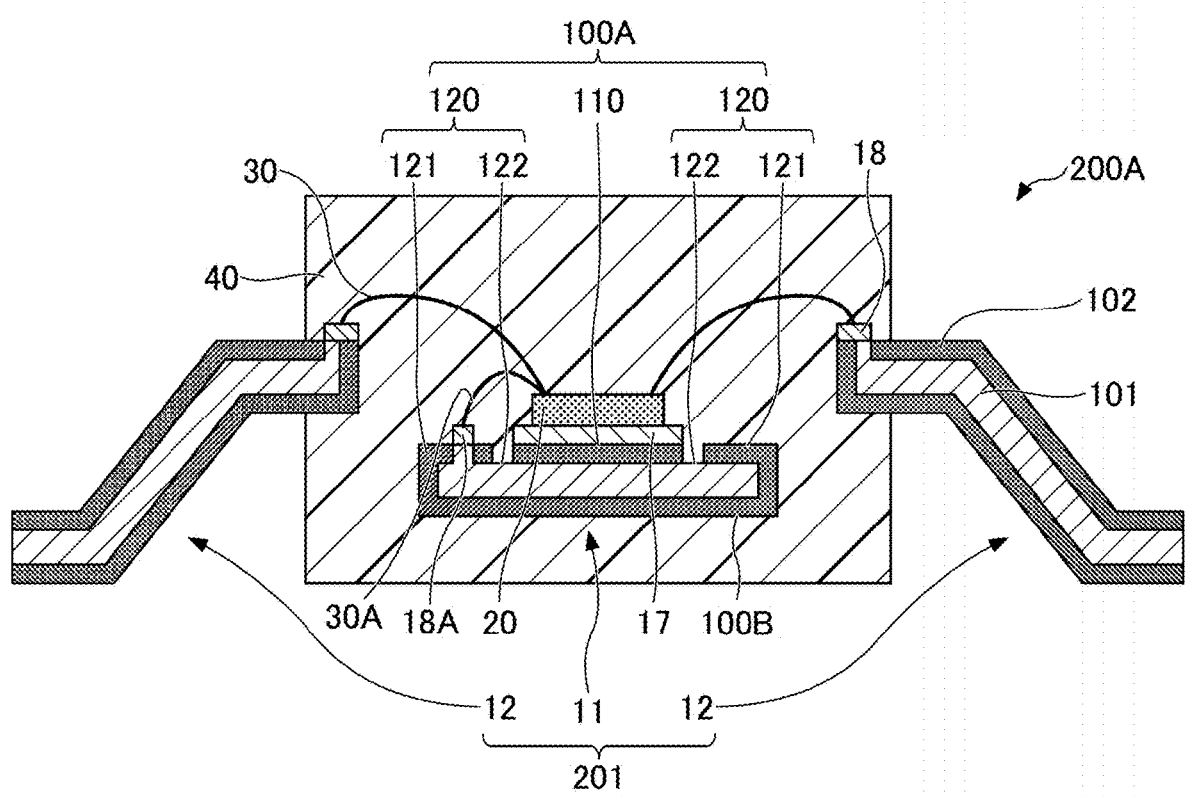
FIG. 21 is a cross-sectional view of a variation of a semiconductor device.

In the following, a variation of the second embodiment will be described. FIG. 21 is a cross-sectional view illustrating an example of a semiconductor device according to the variation of the second embodiment;

In a semiconductor device 200A according to the variation of the second embodiment, as illustrated in FIG. 21, a wire bonding area is provided in the die pad 11, with a plating film 18A formed on this wire bonding area. The plating film 18A may be formed simultaneously with plating film 18. A metal line 30A is further provided that electrically connects the plating film 18A and an electrode terminal used as a ground terminal formed on the upper surface of the semiconductor chip 20.

In the semiconductor device 200A, the die pad 11 may be used as a ground conductor, with the metal line 30A connecting the die pad 11 and the ground terminal of the semiconductor chip 20.

It may be noted that the type of package used with the lead frame of the present disclosure is not limited to a specific type. The lead frame of the present disclosure can be used in various packages such as a QFP (quad flat package) and a QFN (quad flat non-leaded package), for example.

According to at least one embodiment, the deterioration of adhesion for the encapsulating resin caused by a solvent component contained in an adhesive is reduced, and undermining of wire bonding is avoided.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

One aspect of the subject-matter described herein is set out non-exclusively in the following numbered clauses.

[Clause 1] A method of making a lead frame which has, on a first surface thereof, a first area for mounting a semiconductor chip and a second area around the first area, the method comprising:

forming a roughened surface at least on the first surface of the lead frame; and flattening part of the roughed surface in the second area to form a less-rough area while leaving a rest of the roughed surface as a roughened area, the less-rough area being situated between the roughened area and the first area, the less-rough area having a higher flatness than the roughened area.

[Clause 2] The method as recited in clause 1, wherein the forming a roughened surface includes forming the roughened surface in the first area.

[Clause 3] The method as recited in clause 1 or 2, wherein the forming a roughened surface includes forming the roughened surface on a second surface opposite the first surface.

[Clause 4] The method as recited in any one of clauses 1 to 3, wherein an S ratio of the roughened area is in a range of 1.05 to 2.20, and an S ratio of the less-rough area is in a range of 1.01 to 1.10.

[Clause 5] The method as recited in clause 1, wherein the forming a roughened surface includes forming the roughened surface in the first area, the less-rough area having a higher flatness than the roughened surface of the first area.

[Clause 6] The method as recited in claim 1, wherein the forming a roughened surface includes forming the roughened surface on a second surface opposite the first surface, the less-rough area having a higher flatness than the roughened surface of the second surface.

What is claimed is:

1. A lead frame comprising:
a die pad; and
leads disposed apart from the die pad,
wherein a first surface of the die pad includes:
a first area for mounting a semiconductor chip; and
a second area around the first area, wherein the second area includes a roughened area and a less-rough area situated between the roughened area and the first area, the less-rough area having a higher flatness than the roughened area, wherein an oxide film is formed on a surface of the lead frame, and wherein the roughened area is constituted by the oxide film, and the less-rough area is constituted by a flattened portion of the oxide film where needle crystals of the oxide film are flattened.

2. The lead frame as claimed in claim 1, wherein the first area includes a roughened area.

3. The lead frame as claimed in claim 1, wherein a second surface of the die pad opposite the first surface has a roughened area.

4. The lead frame as claimed in claim 1, wherein an S ratio of the roughened area is in a range of 1.05 to 2.20, and an S ratio of the less-rough area is in a range of 1.01 to 1.10.

5. The lead frame as claimed in claim 1, wherein the first area includes a roughened area, the less-rough area having a higher flatness than the roughened area of the first area.

6. The lead frame as claimed in claim 1, wherein a second surface of the die pad opposite the first surface has a roughened area, the less-rough area having a higher flatness than the roughened area of the second surface.

7. A semiconductor device, comprising:
the lead frame of claim 1;
the semiconductor chip mounted on the first area via an adhesive; and
an encapsulating resin disposed in contact with the second area and encapsulating the semiconductor chip.

8. The lead frame as claimed in claim 1, wherein the first surface of the die pad is a planar continuous surface on which the first area and the second area are situated, such that on the planar continuous surface, the first area is continuous with the second area.

9. The lead frame as claimed in claim 1, wherein the first surface of the die pad is a rectangular continuous surface in a plan view on which the first area and the second area are situated.

10. The lead frame as claimed in claim 1, further comprising a connection part disposed in the roughened area of the die pad, the connection part being for electrical connection with the semiconductor chip.

11. A lead frame comprising:
a die pad; and
leads disposed apart from the die pad,
wherein a first surface of the die pad includes:
a first area for mounting a semiconductor chip; and
a second area around the first area,
wherein the second area includes a roughened area and a less-rough area situated between the roughened area and the first area, the less-rough area having a higher flatness than the roughened area,
wherein a roughened plating film is formed on a surface of the lead frame, and
wherein the roughened area is constituted by the roughened plating film, and the less-rough area is constituted by a flattened portion of the roughened plating film where crystals of the roughened plating film are flattened.

12. The lead frame as claimed in claim 11, wherein the first area includes a roughened area.

13. The lead frame as claimed in claim 11, wherein a second surface of the die pad opposite the first surface has a roughened area.

14. The lead frame as claimed in claim 11, wherein an S ratio of the roughened area is in a range of 1.05 to 2.20, and an S ratio of the less-rough area is in a range of 1.01 to 1.10.

15. The lead frame as claimed in claim 11, wherein the first area includes a roughened area, the less-rough area having a higher flatness than the roughened area of the first area.

16. The lead frame as claimed in claim 11, wherein a second surface of the die pad opposite the first surface has a roughened area, the less-rough area having a higher flatness than the roughened area of the second surface.

17. A semiconductor device, comprising:
the lead frame of claim 12;
the semiconductor chip mounted on the first area via an adhesive; and
an encapsulating resin disposed in contact with the second area and encapsulating the semiconductor chip.

18. The lead frame as claimed in claim 11, wherein the first surface of the die pad is a planar continuous surface on which the first area and the second area are situated, such that on the planar continuous surface, the first area is continuous with the second area.

19. The lead frame as claimed in claim 11, wherein the first surface of the die pad is a rectangular continuous surface in a plan view on which the first area and the second area are situated.

20. The lead frame as claimed in claim 11, further comprising a connection part disposed in the roughened area of the die pad, the connection part being for electrical connection with the semiconductor chip.

* * * * *